United States Patent
Sato et al.

(10) Patent No.: US 10,304,771 B2
(45) Date of Patent: May 28, 2019

(54) ASSEMBLIES HAVING SHIELD LINES OF AN UPPER WIRING LAYER ELECTRICALLY COUPLED WITH SHIELD LINES OF A LOWER WIRING LAYER

(71) Applicant: Micron Technology, Inc., Boise, ID (US)

(72) Inventors: Makoto Sato, Sagamihara (JP); Ryota Suzuki, Zama (JP)

(73) Assignee: Micron Technology, Inc., Boise, ID (US)

(*) Notice: Subject to any disclaimer, the term of this patent is extended or adjusted under 35 U.S.C. 154(b) by 119 days.

(21) Appl. No.: 15/456,254

(22) Filed: Mar. 10, 2017

(65) Prior Publication Data

US 2018/0261539 A1 Sep. 13, 2018

(51) Int. Cl.
- H01L 23/48 (2006.01)
- H01L 21/4763 (2006.01)
- H01L 23/522 (2006.01)
- H01L 23/528 (2006.01)

(52) U.S. Cl.
CPC ........ *H01L 23/5225* (2013.01); *H01L 23/481* (2013.01); *H01L 23/528* (2013.01); *H01L 23/5226* (2013.01)

(58) Field of Classification Search
CPC ............ H01L 23/5225; H01L 23/5226; H01L 23/528; H01L 23/481
See application file for complete search history.

(56) References Cited

U.S. PATENT DOCUMENTS

| | | |
|---|---|---|
| 5,136,358 A | 8/1992 | Sakai |
| 5,289,037 A | 2/1994 | Savignac |
| 6,510,545 B1 | 1/2003 | Yee |
| 6,522,011 B1 | 2/2003 | Farrar |
| 9,754,872 B1 * | 9/2017 | Sato ............... H01L 23/5225 |
| 2001/0048163 A1 | 12/2001 | Kohno |
| 2002/0088977 A1 | 7/2002 | Mori et al. |
| 2002/0127782 A1 | 9/2002 | Fukui |
| 2003/0020098 A1 | 1/2003 | Sasaki |

(Continued)

FOREIGN PATENT DOCUMENTS

KR 10-2006-0100885 9/2006

OTHER PUBLICATIONS

U.S. Appl. No. 15/155,334, filed May 16, 2016 by Makoto Sato.

(Continued)

*Primary Examiner* — Alonzo Chambliss
(74) *Attorney, Agent, or Firm* — Wells St. John P.S.

(57) ABSTRACT

Some embodiments include an apparatus having first, second, third and fourth wiring tracks. The first and third wiring tracks sandwich the second wiring track therebetween, and the second and fourth wiring tracks sandwich the third wiring track therebetween. A lower-level wiring layer includes a first wiring which has a first portion extending along the second wiring track, a second portion extending along the first wiring track, and a third portion extending along the third wiring track. An upper-level wiring layer includes a second wiring electrically connected to the first wiring and having a fourth portion extending along the third wiring track. The third portion of the first wiring is coupled with the fourth portion of the second wiring.

19 Claims, 21 Drawing Sheets

(56) References Cited

U.S. PATENT DOCUMENTS

| | | |
|---|---|---|
| 2004/0026716 A1* | 2/2004 | Ishimatsu .............. G11C 29/70 257/207 |
| 2005/0168618 A1 | 8/2005 | Okita |
| 2006/0220215 A1 | 10/2006 | Lee |
| 2007/0080436 A1 | 4/2007 | Chun et al. |
| 2007/0120261 A1 | 5/2007 | Ho |
| 2008/0063967 A1 | 3/2008 | Shin et al. |
| 2008/0079161 A1 | 4/2008 | Kim |
| 2009/0026503 A1 | 1/2009 | Tsuda |
| 2009/0237186 A1 | 9/2009 | Onda |
| 2010/0216284 A1 | 8/2010 | Nii |
| 2011/0214100 A1 | 9/2011 | McElvain |
| 2012/0127773 A1 | 5/2012 | Onda |
| 2012/0261831 A1 | 10/2012 | Sudo |
| 2014/0001639 A1 | 1/2014 | Hiraishi |
| 2017/0352620 A1* | 12/2017 | Sato .................... H01L 23/5225 |

OTHER PUBLICATIONS

WO PCT/US2017/024835 Search Rept., dated Jul. 11, 2017, Micron Technology, Inc.
WO PCT/US2017/024835 Writ. Opin., dated Jul. 11, 2017, Micron Technology, Inc.
WO PCT/US2017/024835 IPRP, dated Nov. 20, 2018, Micron Technology, Inc.

* cited by examiner

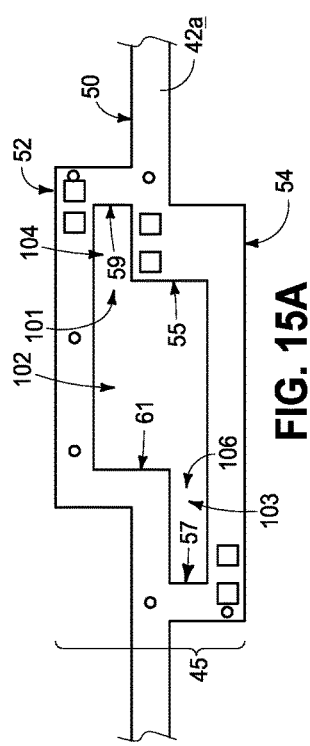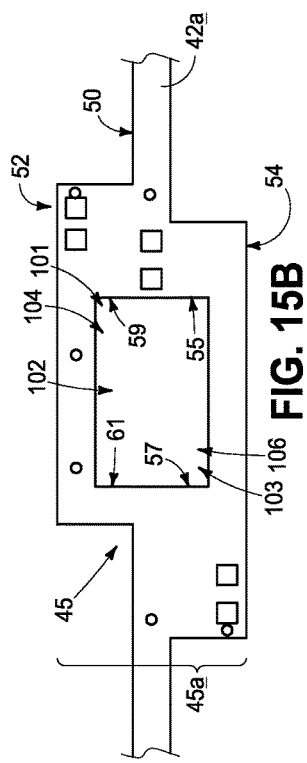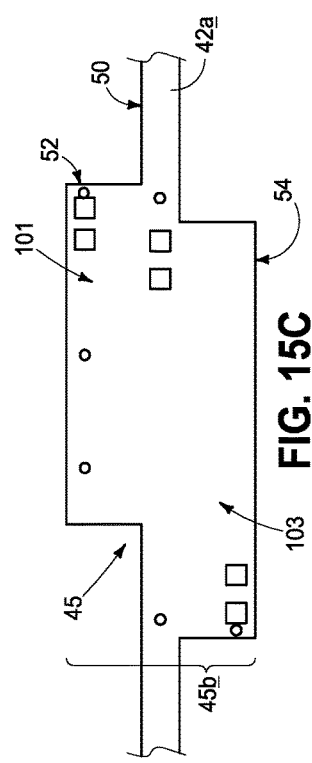

ASSEMBLIES HAVING SHIELD LINES OF AN UPPER WIRING LAYER ELECTRICALLY COUPLED WITH SHIELD LINES OF A LOWER WIRING LAYER

TECHNICAL FIELD

Assemblies having shield lines of an upper wiring layer electrically coupled with shield lines of a lower wiring layer.

BACKGROUND

Integrated circuitry may comprise multiple levels of stacked wiring. The levels may include signal lines alternately arranged with shield lines. The shield lines may be utilized to alleviate cross-talk between adjacent signal lines. An example configuration comprising three stacked wiring layers is shown in FIG. 1. Specifically, the configuration shows a first wiring layer (i.e., first wiring level) M1, a second wiring layer (i.e., second wiring level) M2, and a third wiring layer (i.e., third wiring level) M3; with M3 being over M2 which in turn is over M1. Although three wiring layers are shown, it is to be understood that there may be other wiring layers below the illustrated wiring layers and/or above the illustrated wiring layers. Also, although the illustrated wiring layers are labeled M1-M3, if other wiring layers are present the shown layers may be M2-M4; M3-M6; etc., depending on the number of wiring layers beneath the illustrated wiring layers.

Each of the illustrated wiring layers comprises signal lines alternately arranged with shield lines. It may be desired for the shield lines within one wiring layer to be electrically connected with shield lines of other wiring layers vertically offset from said one wiring layer. For instance, it may be desired for the shield lines within wiring layer M2 to be electrically connected with the shield lines within wiring layer M1 and the shield lines within wiring layer M3, as such may alleviate coupling noises between the vertically-stacked wiring layers.

Connection of shield lines from wiring layer M2 with those of wiring layer M1 is relatively straightforward since the lines within wiring layer M1 run perpendicular to the lines within wiring layer M2. However, the connection of shield lines from wiring layer M2 with those of wiring layer M3 is problematic since the lines within wiring layer M2 run parallel to the lines within wiring layer M3, and the shield lines are staggered in wiring layer M2 relative to wiring layer M3. Thus, there is no vertical overlap between the shield lines of wiring layer M2 with those of wiring layer M3.

It is desirable to develop architectures which enable coupling between shield lines of stacked wiring layers of the type illustrated as wiring layers M2 and M3 in FIG. 1.

A prior application (U.S. application Ser. No. 15/155,334; currently assigned to Micron Technology, Inc of Boise, Id.; having Makoto Sato as the inventor; and filed May 16, 2016) discloses example architectures for coupling shield lines of wiring layer M2 with shield lines of wiring layer M3. Such architectures are described in FIGS. 2, 3A and 3B. The architectures are labeled "PRIOR ART" in that they predate the present application, but may not be strictly "prior art" for purposes of ascertaining novelty and obviousness of the claims of the present application in that the prior application and the present application are both presently assigned to the same entity (Micron Technology, Inc.), and have an inventor in common (Makoto Sato).

FIG. 2 shows an assembly 300 comprising the wiring layers M1, M2 and M3 stacked one atop another, and shows the wiring layers an exploded view. The lines within wiring layer M3 (shield lines 306 and signal lines 307) are shown to be slightly thicker than the lines within wiring layers M2 (shield lines 308 and signal lines 309) and M1 (shield lines 312 and signal lines 313). In practice the lines within wiring layers M1-M3 may all be the same thickness or some lines may be of different thickness relative to other lines, depending on the application.

The assembly 300 of FIG. 2 comprises a connecting region 302 which encompasses interconnects 304 (only some of which are labeled) at locations where portions of shield lines 306 of wiring layer M3 vertically overlap portions of the shield lines 308 of level M2. The interconnects 304 are shown as square features to diagrammatically represent the interconnects, but in other applications the interconnects 304 may have other shapes.

The shield lines 312 of wiring layer M1 are electrically coupled with the shield lines 308 of wiring layer M2 through vertical interconnects 310 (only some of which are labeled). The interconnects 310 are shown as circular features to diagrammatically represent the interconnects 310 and to enable interconnects 310 to be readily distinguished from interconnects 304 in the illustration of FIG. 2, but in other applications the interconnects 310 may have other shapes.

FIGS. 3A and 3B show assembly 300 in an alternative diagrammatic illustration. Specifically, the assembly 300 is shown in top view in FIG. 3A, with the lines of the wiring layers being heavily compressed. An expanded region of the top wiring layer M3 is shown in cross-sectional side view in FIG. 3B to assist the reader in understanding the top view of FIG. 3A. An approximate location of the illustrated portion of FIG. 2 is diagrammatically illustrated in FIG. 3A as corresponding to region labeled "FIG. 2". The connecting region 302 is diagrammatically illustrated with a line traversing the top view of FIG. 3A.

A continuing goal of semiconductor fabrication is to increase circuit density (i.e., to increase the level of integration). A problem with the architecture of FIGS. 2, 3A and 3B is that there may be a large distance along individual shield lines of a given wiring layer (e.g., shield lines 306 of wiring layer M3) between the interconnects (304 of FIG. 2) utilized to couple the shield lines to shield lines of other wiring layers (e.g., shield lines 308 of wiring layer M2, shown in FIG. 2). Such problem is illustrated in the top view of FIG. 3A with an arrow 320 indicating a pitch between interconnects (i.e., a via-bypass pitch). The arrow 320 is open-ended to indicate that the full via-bypass pitch is not visible in the top view of FIG. 3A.

The signal lines (e.g., signal lines 307 of wiring layer M3, signal lines 309 of wiring layer M2, etc.) are coupled with associated buses (i.e., electrical pathways), and the number of signal lines coupled with an individual bus may be correlated with the via-bypass pitch.

As circuit density increases, there may be an increasing demand on the shield lines (e.g., increased voltage along the shield lines and/or increased current along the shield lines). Also, increased density of signal lines may lead to increased resistance along the signal lines and the associated buses. Accordingly, it would be desired to develop new architectures which reduce distances between interconnects coupling shield lines of one wiring layer to the shield lines of another wiring layer, and which reduce resistances along the signal lines and associated buses.

BRIEF DESCRIPTION OF THE DRAWINGS

FIGS. 15A-15C are expanded diagrammatic top views of a region of the M2 wiring layer of FIG. 11 showing example alternative configurations.

DETAILED DESCRIPTION OF THE ILLUSTRATED EMBODIMENTS

Figure 1:
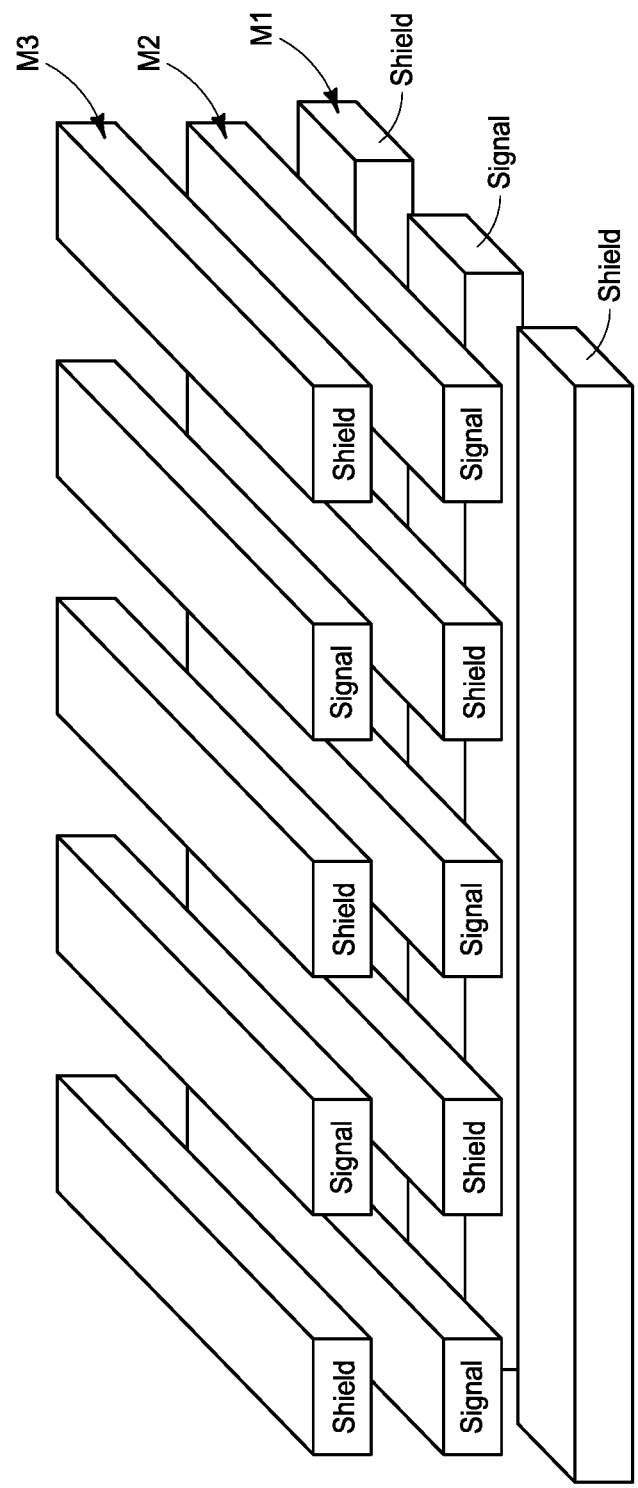
FIG. 1 is a diagrammatic three-dimensional view of a prior art arrangement of wiring layers.

In some embodiments, the invention includes architectures which reduce distances between interconnects coupling the shield lines of an upper wiring layer (e.g., M3) to the shield lines of a lower wiring layer (e.g., M2) as compared to the prior art architectures described in the BACKGROUND section above, which enables decreased via-bypass pitch as compared to the prior art architectures.

The signal lines within a given via-bypass pitch may be coupled with a common bus. Accordingly, decreasing the via-bypass pitch may lead to a reduction of the number of signal lines associated with each bus, and thus may lead to reduced resistance across the signal lines and associated buses.

In some embodiments, one or more redundant (dummy) lanes are provided within the shield line/signal line circuitry of wiring layers (e.g., M2 and M3) in order to enable a reduction of the via-bypass pitch. In such embodiments, bus lines may be considered to be arranged amongst subgroups by providing one or more redundant (dummy) lanes within the signal line/shield line circuitry. For instance, the number of bus lines may be represented as "n", and the bus lines may be arranged into "m" subgroups; with each of the "m" subgroups having "k" signal lines. In some embodiments, the via-bypass pitch on the shield lines may be 1/m as compared to prior architectures in which the bus lines are not consolidated into the subgroups.

As indicated above, the term "dummy" may be utilized to describe the redundant lanes, with such term indicating that the redundant lanes are different than the other lanes comprising shield/signal lines. In some contexts, the label "dummy" is utilized to identify structures which have no function other than to serve as spacers (i.e., which are not utilized as wiring or components of integrated circuitry). Such is generally not the case in the present context. Instead, the "dummy" structures may include circuitry (for instance, shield lines), and the label "dummy" may be utilized to indicate that a structure (for instance, a shield line) within a wiring layer has a different configuration and/or use than other similar structures across the wiring layer having more traditional configurations.

The dummy (i.e., redundant) structures may be configured as "lanes", or may correspond to other suitable structures and regions.

Example calculations relative to a configuration having 288 signal lines indicate that a single group (i.e., only one sub-group) leads to a worst resistance value of 40.95 ohms, two subgroups leads to the worst resistance value being 21.85 ohms, eight subgroups leads to the worst resistance value being 12.23 ohms, and 16 subgroups leads to the worst resistance value being 6.73 ohms. Accordingly, arrangement of the signal lines amongst subgroups may lead to substantial improvement (specifically, reduction in resistance) as compared to prior architectures. The calculated resistance values are provided to assist the reader in understanding the invention, and are not to be utilized for limiting the claims that follow; except to the extent, if any, that such values are expressly recited in the claims.

Figure 2:
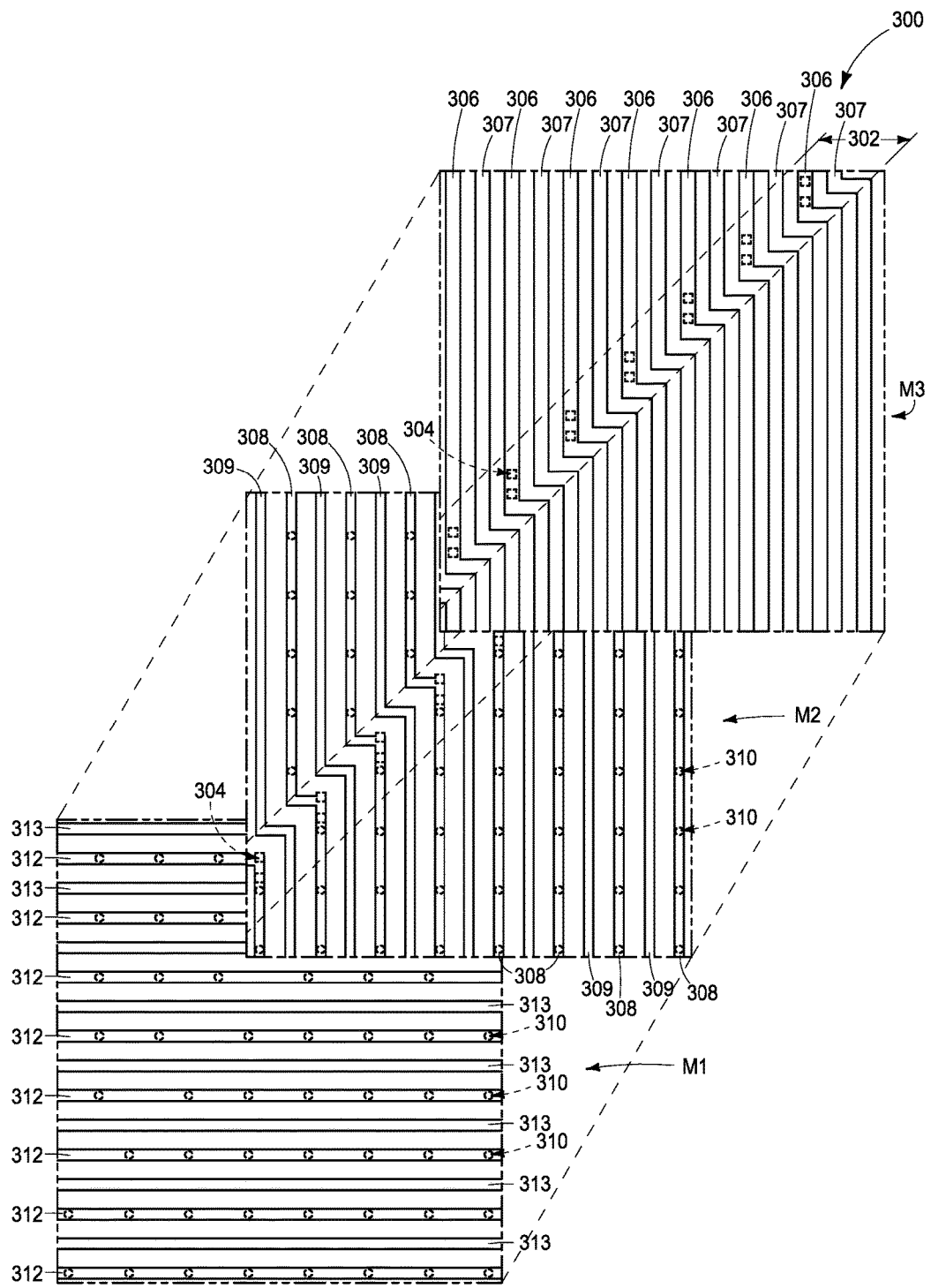
FIG. 2 is an exploded view of a prior art assembly having three wiring layers.
Figure 3:
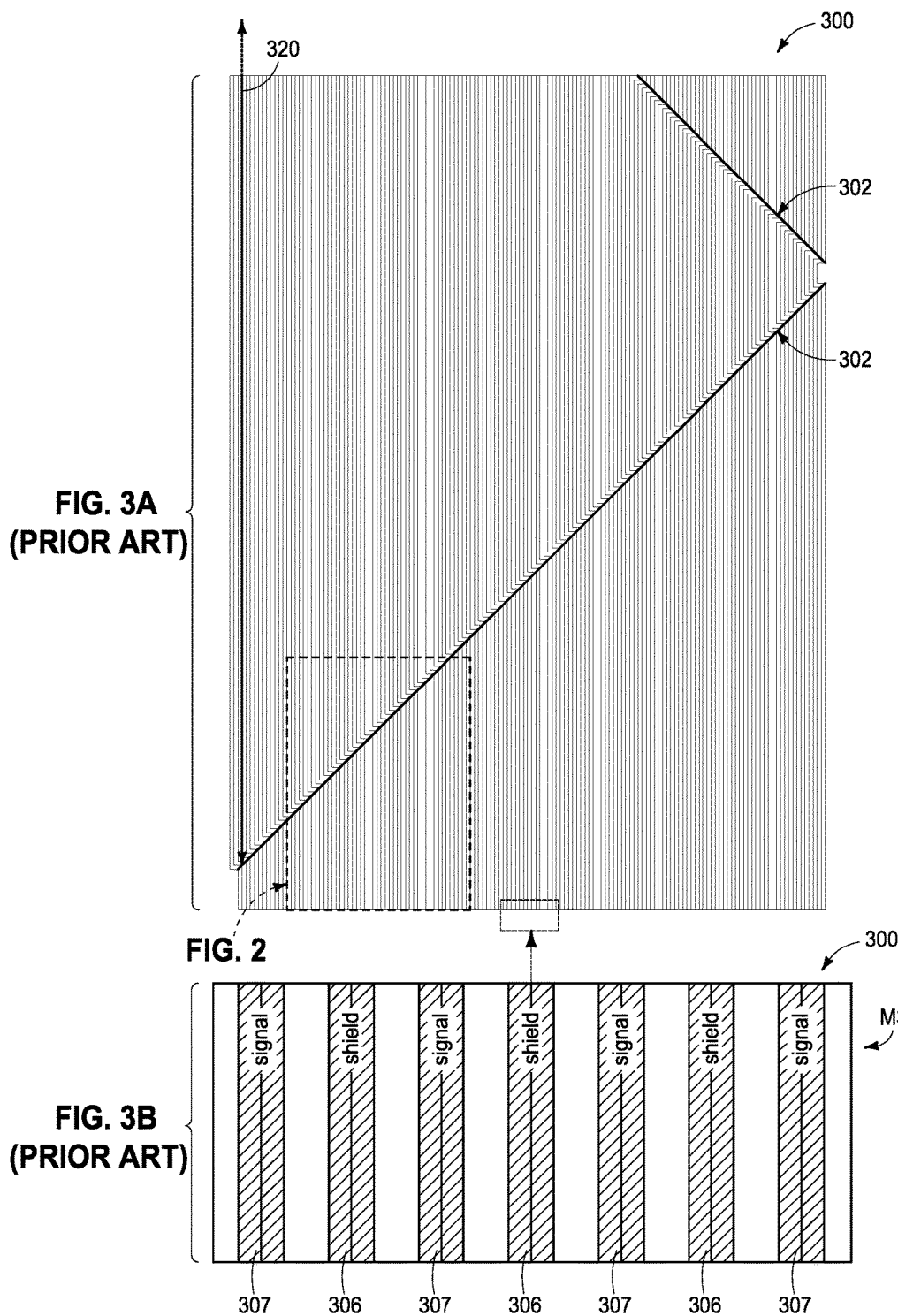
FIG. 3A is a diagrammatic top view of the prior art assembly of wiring layers across a substrate.
FIG. 3B is a view of an expanded region of FIG. 3A to illustrate alternating signal lines and shield lines. The three wiring layers of FIG. 2 are stacked in the top view of FIG. 3A, with the portion shown in FIG. 2 being within a region "FIG. 2" of FIG. 3A.

FIGS. 4A and 4B show an assembly 10 analogous to the assembly 300 of FIGS. 3A and 3B. Such assembly may comprise the wiring layers M1, M2 and M3 (analogous to those of FIG. 2) stacked one atop another. FIG. 4A shows a top view with the lines of the upper wiring layer M3 being heavily compressed (analogous to the top view of prior art FIG. 3A), and FIG. 4B shows an expanded region of the top wiring layer M3 in cross-sectional side view. The wiring layer M3 of FIG. 4B comprises shield lines 12 and signal lines 14 analogous to the shield lines 306 and signal lines 307 of FIG. 3B. Additionally, the wiring layer M3 of FIGS. 4A and 4B comprises a redundant (dummy) lane 15 which segregates the shield lines/signal lines of the wiring layer M3 into subgroups 16a and 16b.

A connecting region 18a is associated with subgroup 16a, and a connecting region 18b is associated with subgroup 16b; and such connecting regions 18a/18b are diagrammatically illustrated with lines traversing the top view of FIG. 4A. The connecting regions 18a/18b are analogous to the connecting region 302 of FIG. 3A. However, the connecting regions 18a/18b are on a reduced pitch relative to the connecting region 302 of FIG. 3A, which reduces the via-bypass pitch. Specifically, an arrow 21 is provided in FIG. 4A to diagrammatically illustrate a via-bypass pitch. Such via-bypass pitch 21 is substantially reduced (and in some embodiments may be reduced by about half) as compared to the via-bypass pitch 320 of the assembly 300 of FIG. 4A. The reduction of the via-bypass pitch may substantially reduce resistance along the signal lines and associated buses of assembly 10 of FIG. 4A as compared to the assembly 300 of FIG. 3A.

Figure 4:
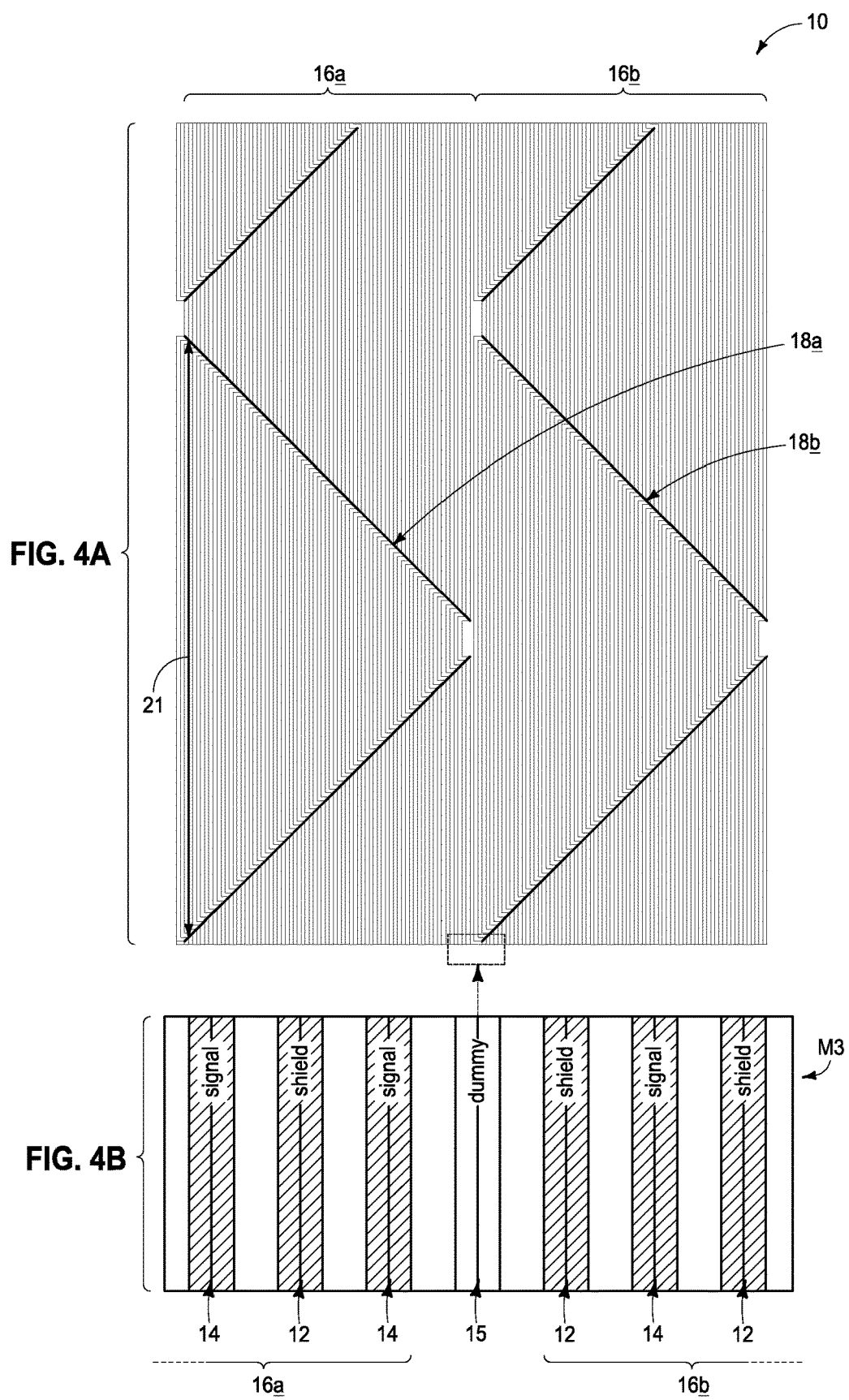
FIG. 4A is a diagrammatic top view of an example arrangement of circuitry across a substrate.
FIG. 4B is a view of an expanded region of FIG. 4A to illustrate alternating signal lines and shield lines, and to show a redundant (or dummy) structure.
Figure 5:
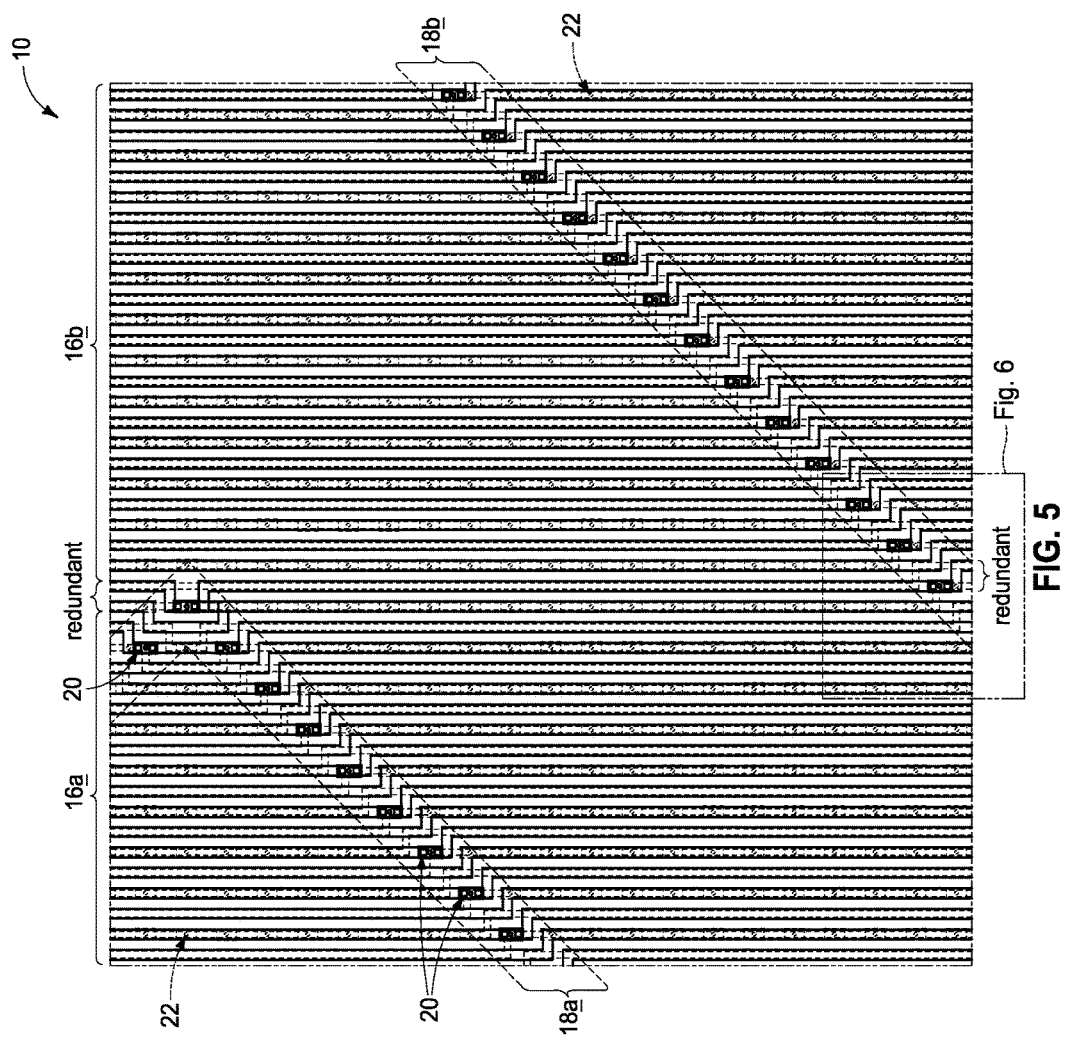
FIG. 5 is a diagrammatic top view of an example arrangement of circuitry from two stacked wiring layers.
Figure 6:
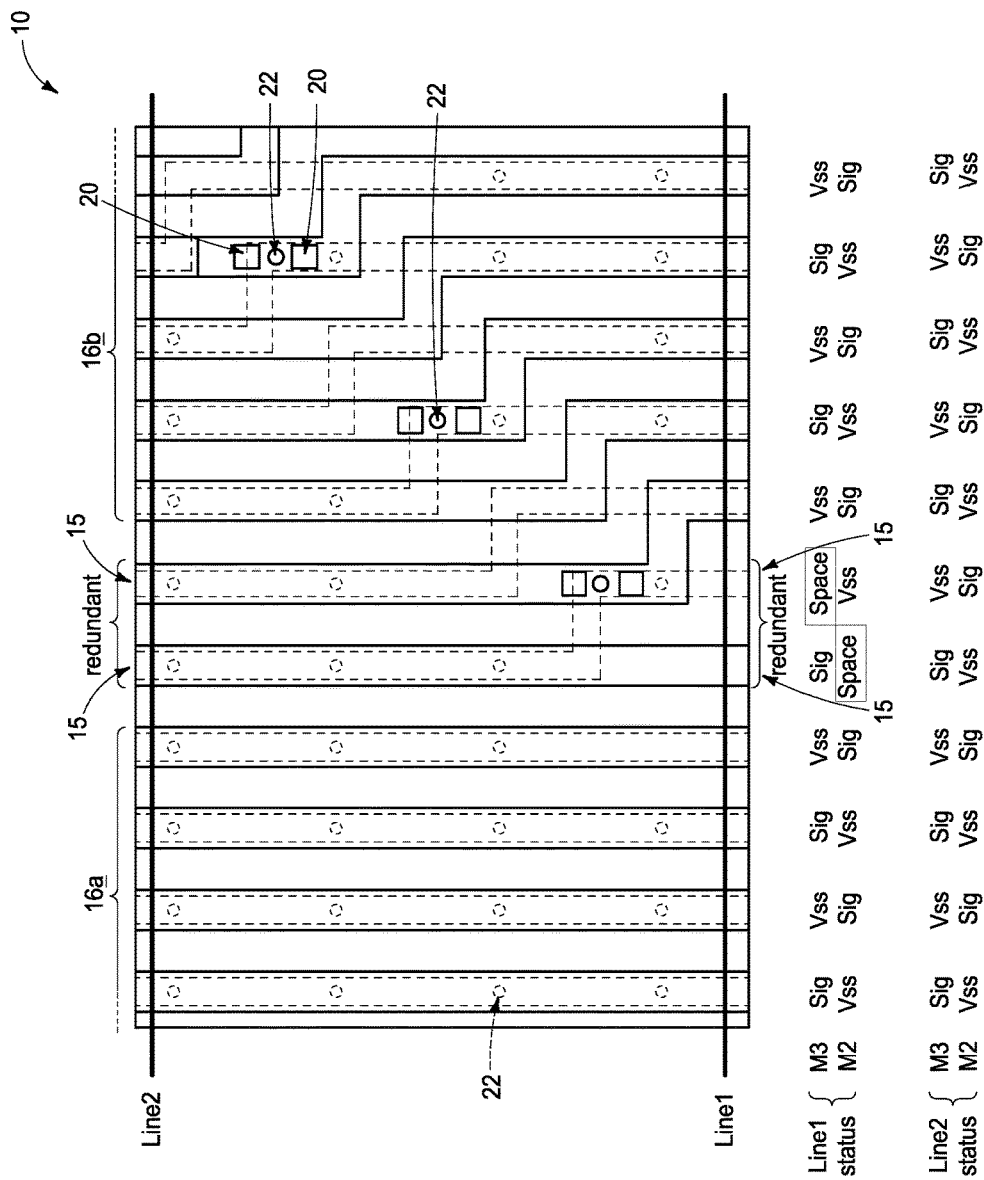
FIG. 6 is a view of an expanded region of FIG. 5 to illustrate alternating signal and shield wiring lines within the stacked wiring layers, and to show redundant (or dummy) structures.

FIGS. 5 and 6 illustrate an alternative view of the assembly 10 of FIG. 4; with the view of FIG. 6 being an expanded region of FIG. 5.

FIGS. 5 and 6 show wiring layer M3 overlaid on wiring layer M2; and show interconnects 20 and 22 analogous to the interconnects 304 and 310, respectively, which were described above with reference to FIG. 2. Specifically, the interconnects 20 vertically connect shield lines of wiring layer M2 with shield lines of wiring layer M3, and the interconnects 22 vertically connect shield lines of wiring layer M2 with shield lines of wiring layer M1 (not shown in FIGS. 5 and 6). The interconnects 20 and 22 are shown as square features and circular features, respectively, to enable the interconnects 20 to be readily distinguished from interconnects 22 in the illustrations, but in other applications the interconnects 20 and 22 may have other shapes; and may be the same shape as one another, or different shapes relative to one another.

The wiring layers M2 and M3 are shown in dashed-line view and solid-line view, respectively, in FIGS. 5 and 6 so that they may be distinguished from one another.

FIG. 6 shows a pair of lines (Line1 and Line2) provided across the assembly 10, with the status (configuration) of materials in the M2 and M3 wiring layers at locations of each line being described in a table beneath the diagram of assembly 10. The signal lines are represented as "Sig", and the shield lines are represented as "Vss". The term Vss is chosen in that it is common for the shield lines of the wiring layers M3, M2 and M1 to be electrically connected with Vss (with it being understood that the voltage Vss may be any suitable voltage, and in some embodiments may be ground or a negative supply voltage). The shield lines may be coupled with voltage other than Vss in some embodiments.

The table of FIG. 6 shows that the redundant lane 15 differs from other locations of the wiring layers M2/M3 along the position of Line1. Specifically, the redundant lane 15 comprises a space below a signal line of wiring layer M3, and comprises a space above the shield line of wiring layer M2. In contrast, the redundant lane 15 has a same configuration as other locations of the wiring layers M2/M3 at the position of Line2 and simply comprises a Vss line of M3 over a signal line of M2, and a signal line of M3 over a Vss line of M2. Although the term "space" is utilized to describe locations along Line1, it is to be understood that the locations indicated as "space" may comprise insulative materials (e.g., silicon nitride, silicon dioxide, etc.).

Figure 7:
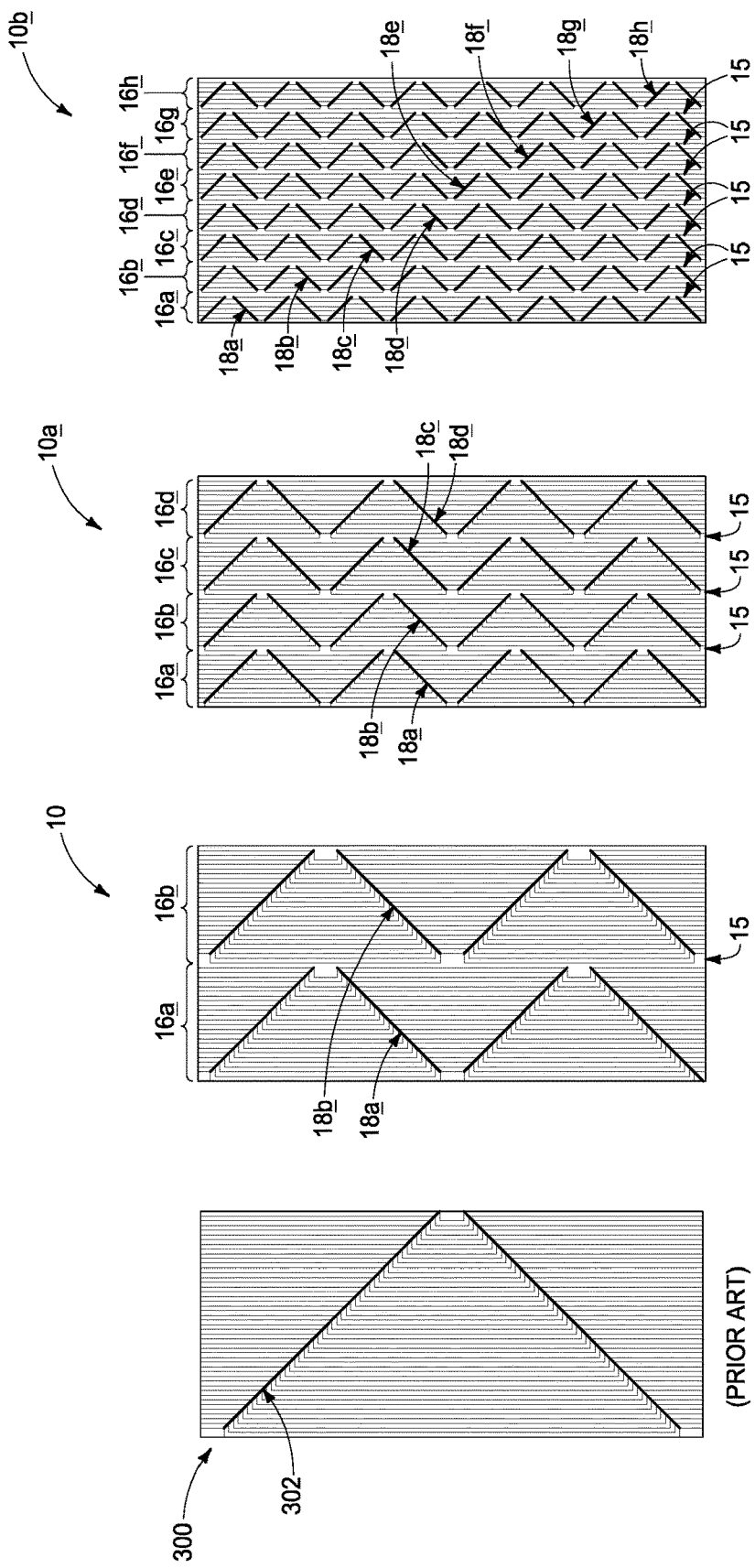
FIG. 7 shows diagrammatic top views comparing example circuit arrangements with a prior art arrangement.

FIG. 7 compares the prior art assembly 300 (described above with reference to FIG. 3A) with example assemblies 10, 10a and 10b of the present invention. The assembly 10 is similar to that described above with reference to FIG. 4A. The assemblies 10a and 10b incorporate additional redundant lanes 15 to thereby form additional subgroups. Specifically, assembly 10 has two subgroups 16a and 16b with associated connecting regions 18a and 18b, respectively; assembly 10a has four subgroups 16a, 16b, 16c and 16d (with corresponding associated connecting regions 18a, 18b, 18c and 18d); and assembly 10b has eight subgroups 16a, 16b, 16c, 16d, 16e, 16f, 16g and 16h (with corresponding associated connecting regions 18a, 18b, 18c, 18d, 18e, 18f, 18g and 18h). Example resistances across signal lines and associated buses within the subgroups are estimated to be about 40.95 ohms for assembly 300; 21.85 ohms for assembly 10; 12.23 ohms for assembly 10a; and 6.73 ohms for assembly 10b. Accordingly, arrangement of the signal lines into subgroups within the assemblies 10, 10a and 10b may lead to substantial improvement (specifically, reduction in resistance across signal lines and associated buses) as compared to prior architectures.

Figure 8:
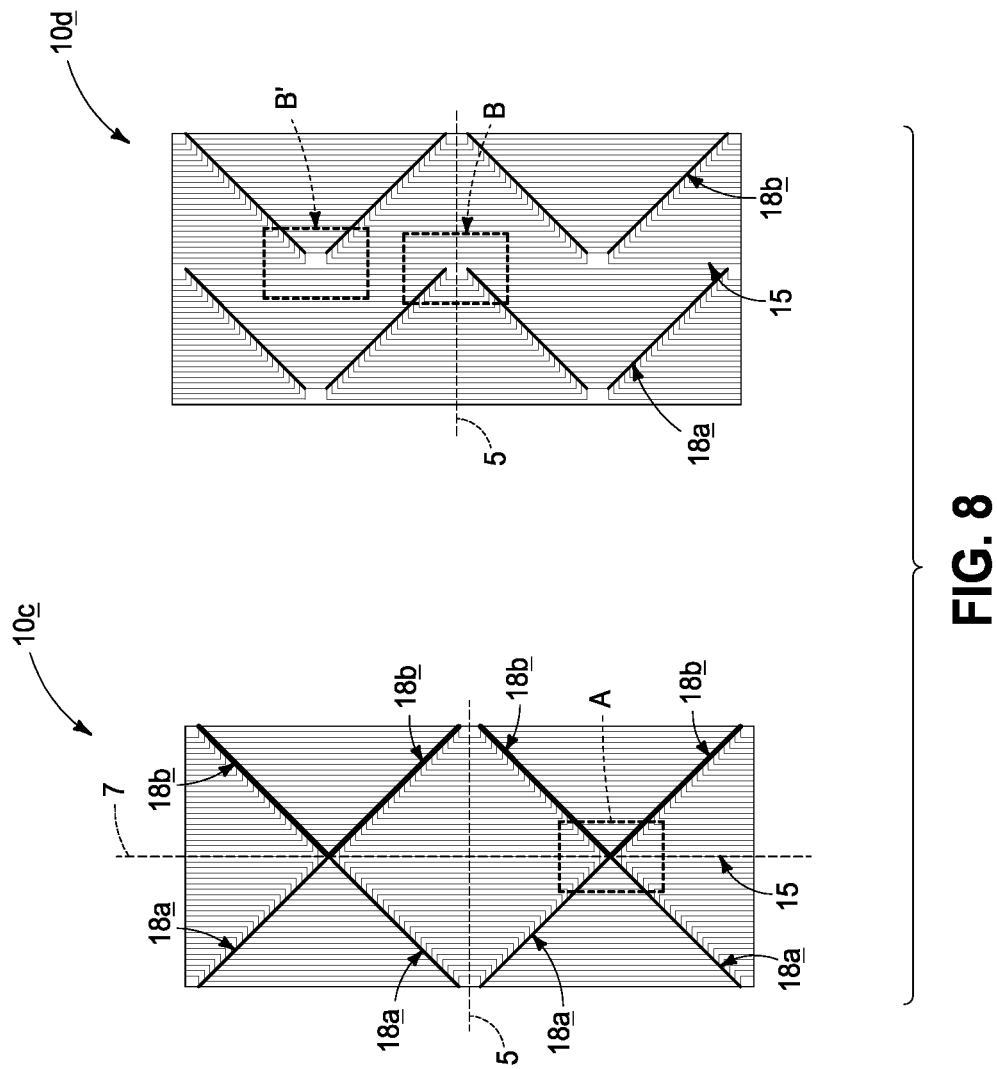
FIG. 8 shows diagrammatic top views comparing a pair of example circuit arrangements.

FIG. 8 shows top views of a pair of example assemblies 10c and 10d which may be utilized in some embodiments. The assembly 10c has connecting regions 18a and 18b which are mirrored about a first plane 5 through a middle of the assembly, and which are also mirrored about a second plane 7 through the middle of the assembly and orthogonal to the first plane 5. The connecting region 18b is shown with a heavier line than the connecting region 18a so that the connecting regions 18a and 18b can be distinguished from one another. A region A is identified in assembly 10c, and such region is discussed in more detail below with reference to FIGS. 9-15.

The assembly 10d has connecting regions 18a and 18b which are mirrored about the plane 5 through the middle of the assembly. Regions B and B' are identified in assembly 10d, and such regions are discussed in more detail below with reference to FIGS. 16-24.

Figure 9:
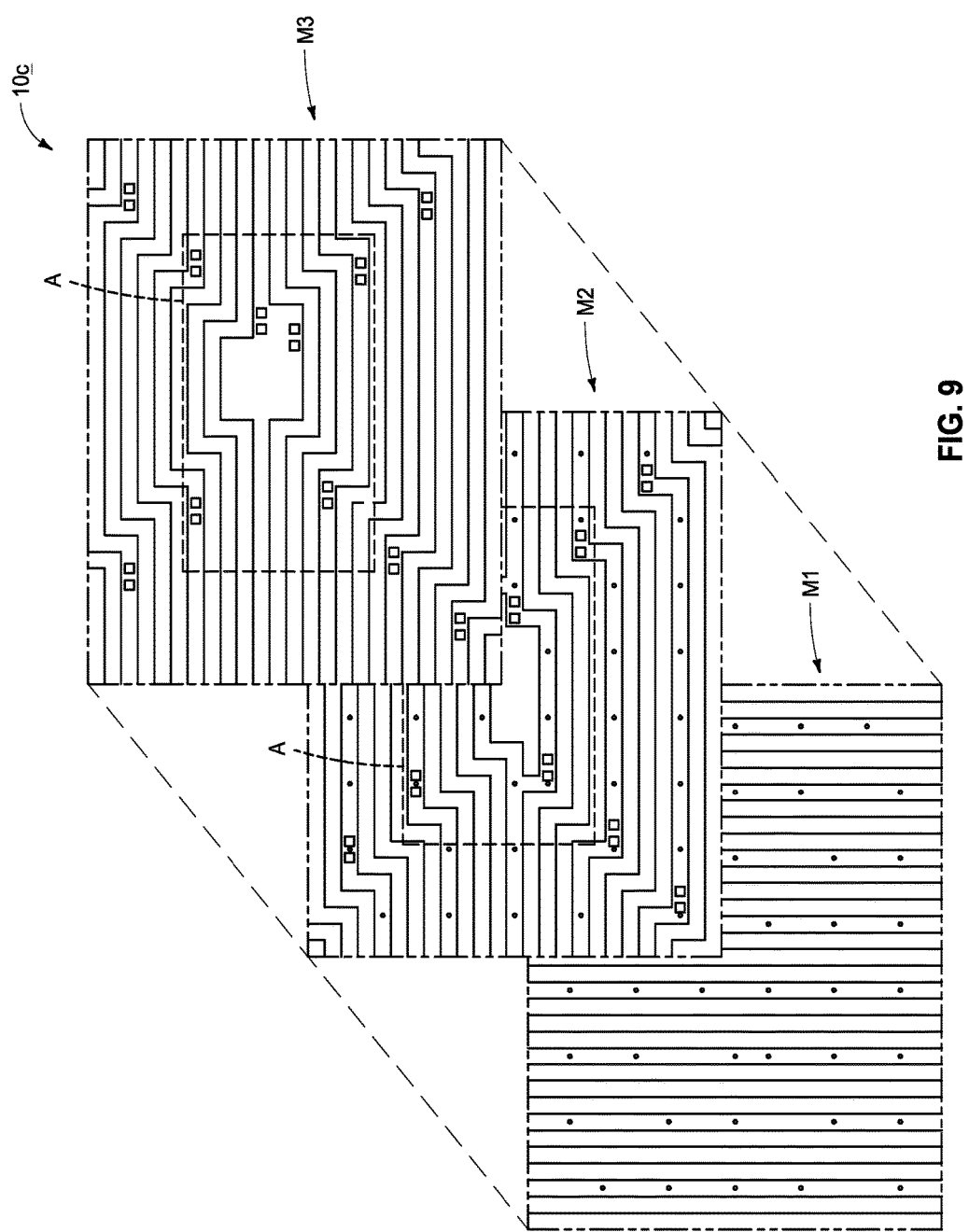
FIG. 9 is an exploded view of an assembly of example wiring layers that may be utilized in one of the circuit arrangements of FIG. 8. Three wiring layers are stacked in the view of FIG. 9.
Figure 10:
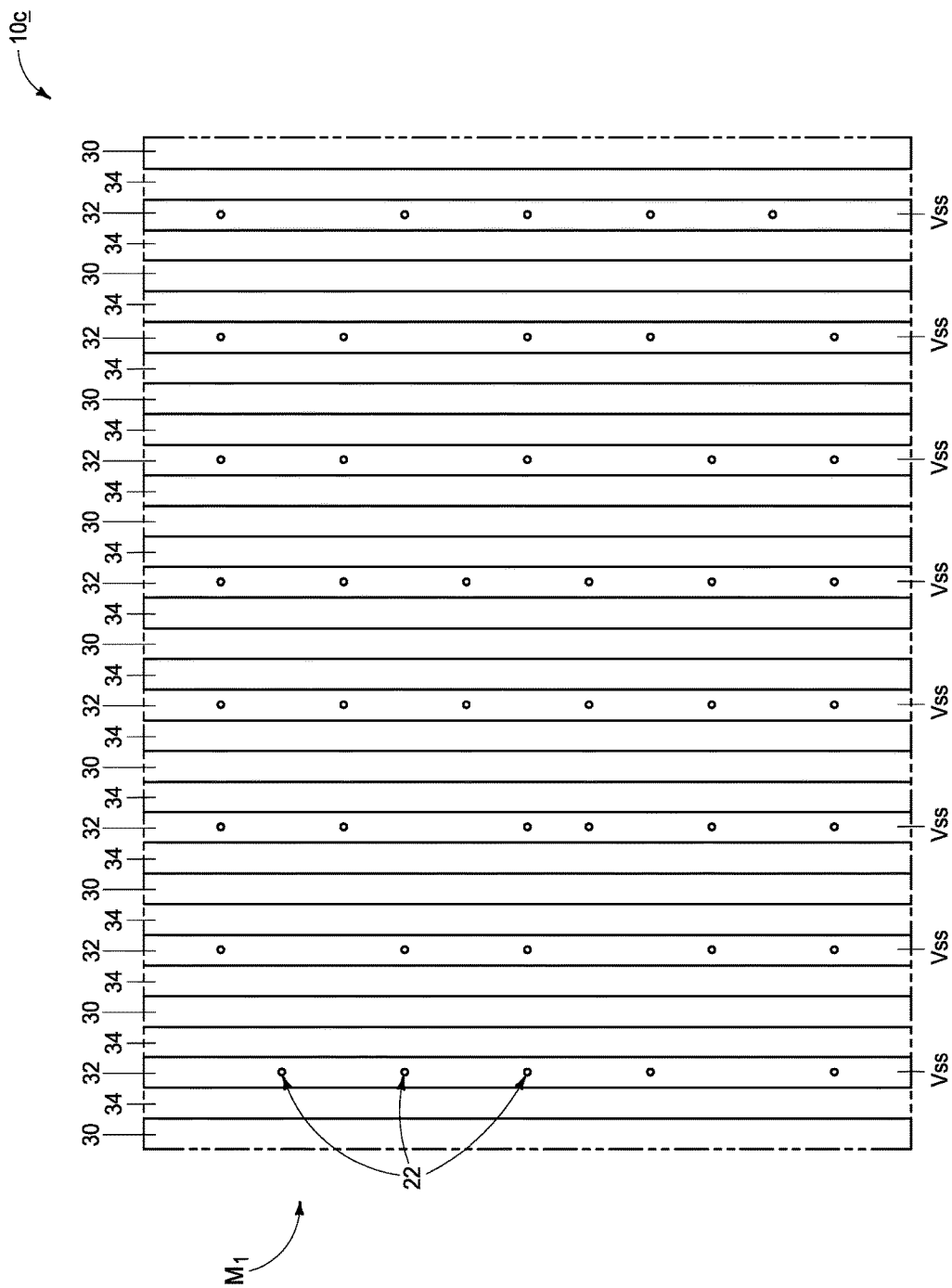
FIGS. 10-12 are diagrammatic top views of the individual wiring layers of FIG. 9.
Figure 11:
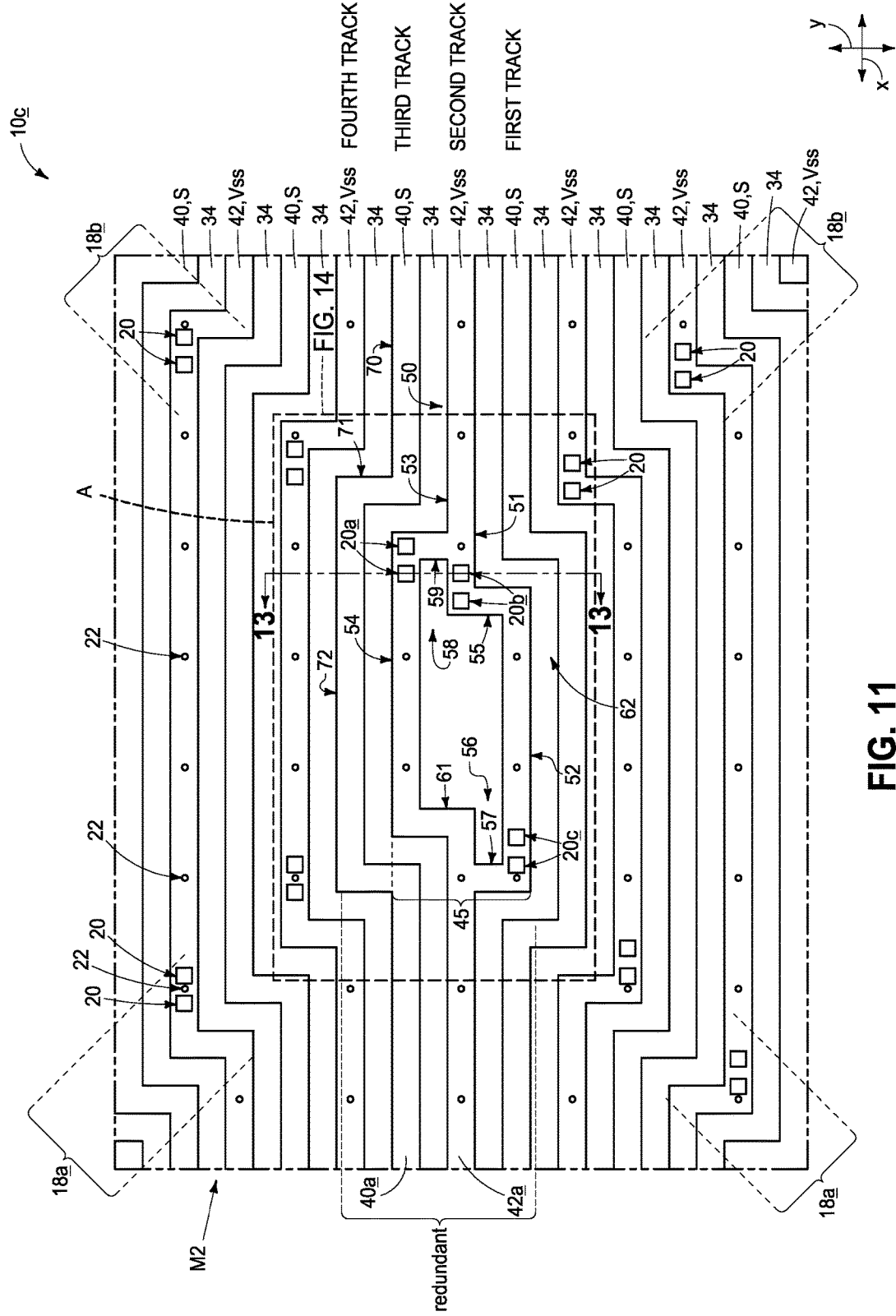
Figure 12:
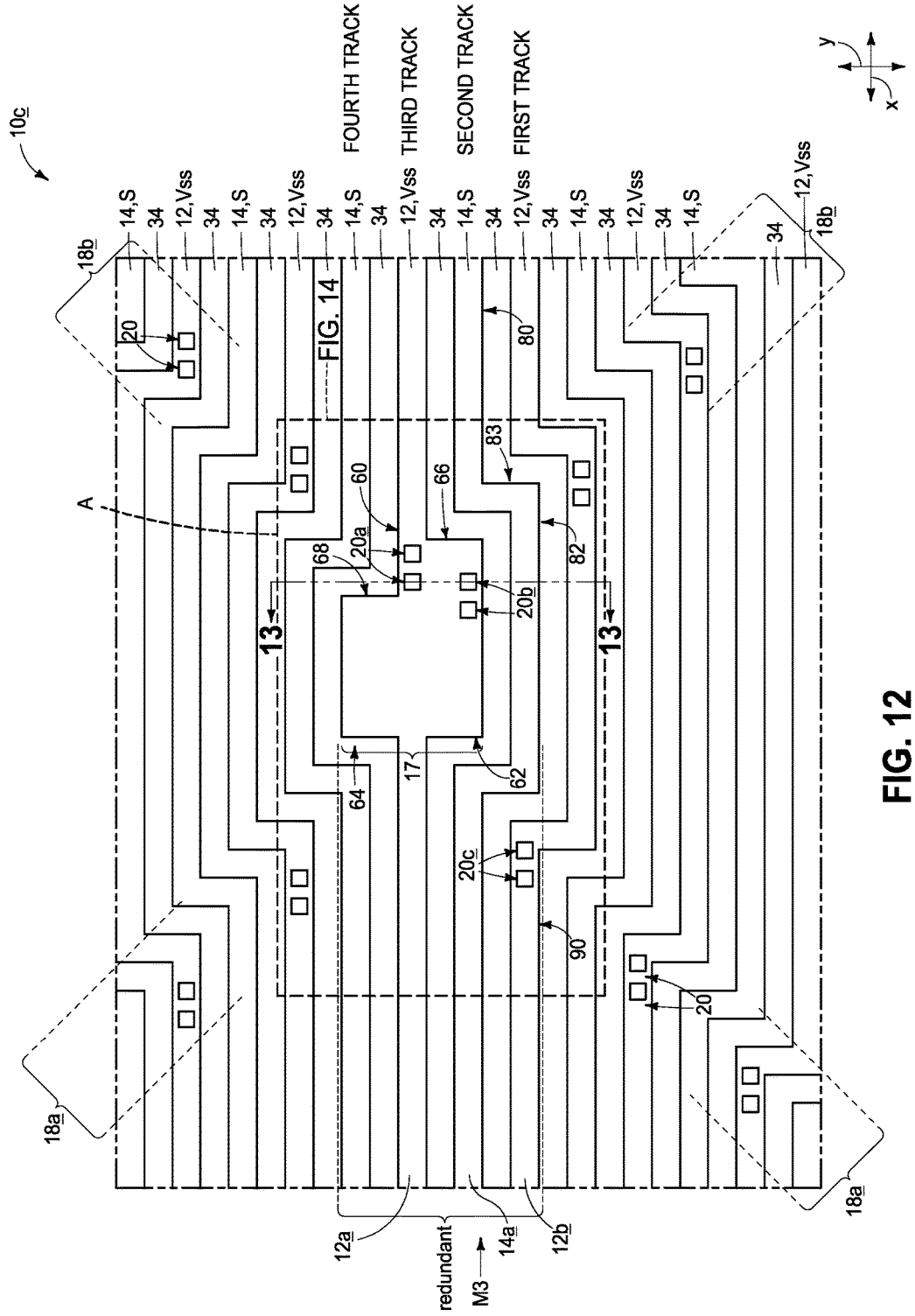

FIGS. 9-12 illustrate assembly 10c, and show the wiring layers M1, M2 and M3. FIG. 9 is an exploded view showing the wiring layers stacked one atop another; while FIGS. 10-12 show each of the individual wiring layers M1, M2 and M3 in isolation.

Referring to FIG. 10, the wiring layer M1 includes signal lines 30 alternating with shield lines 32. The signal lines and shield lines are spaced from one another by insulative material 34. The shield lines 32 are shown supplied with (i.e., coupled with) a fixed voltage identified as Vss, but may be supplied with any suitable voltage.

The signal lines 30 and shield lines 32 may comprise any suitable electrically conductive composition(s), such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). The conductive materials of the signal lines 30 and shield lines 32 may be homogenous, or may comprise two or more discrete compositions. The conductive material of the shield lines 32 may be the same as the conductive material of the signal lines 30, or may be different from the conductive material of the signal lines.

The insulative material 34 may comprise any suitable composition, and in some embodiments may comprise, consist essentially of, or consist of one or both of silicon dioxide and silicon nitride. The insulative material 34 may be homogenous, or may comprise two or more discrete compositions.

The interconnects 22 (only some of which are labeled) are shown along the shield lines 32, with such interconnects 22 being utilized to vertically connect shield lines 32 of wiring layer M1 with shield lines 42 of wiring layer M2 (shown in FIG. 11).

Referring to FIG. 11, the wiring layer M2 includes signal lines 40 alternating with shield lines 42. The signal lines and shield lines are spaced from one another by the insulative material 34. The shield lines 42 are shown coupled with a fixed voltage identified as Vss, but may be coupled with any suitable voltage.

The signal lines 40 and shield lines 42 may comprise any suitable electrically conductive composition(s), such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). The conductive materials of the signal lines 40 and shield lines 42 may be homogenous, or may comprise two or more discrete compositions. The conductive material of the shield lines 42 may be the same as the conductive material of the signal lines 40, or may be different from the conductive material of the signal lines. Further, the lines 40/42 of layer M2 may be the same composition as one or both of the lines 30/32 of layer M1, or may be different compositions from one or both of the lines 30/32 of layer M1.

The interconnects 22 (only some of which are labeled) are shown along the shield lines 42, with such interconnects 22 being utilized to vertically connect shield lines 42 of wiring layer M2 with shield lines 32 of wiring layer M1 (shown in FIG. 10). The interconnects 20 (only some of which are labeled) are also shown along the shield lines 42, with such interconnects 20 being utilized to vertically connect shield lines 42 of wiring layer M2 with shield lines 12 of wiring layer M3 (shown in FIG. 12). The interconnects 20 are shown in paired arrangements (i.e., two interconnects 20 are in each location where shield lines 42 of wiring layer M2 connect with shield lines 12 of wiring layer M3). In other embodiments, only a single interconnect 20 may be in at least some of such locations; and in some embodiments, more than two interconnects 20 may be in at least some of such locations.

Referring to FIG. 12, the wiring layer M3 includes signal lines 14 alternating with shield lines 12. The signal lines and shield lines are spaced from one another by the insulative material 34. The shield lines 12 are shown coupled with a fixed voltage identified as Vss, but may be coupled with any suitable voltage.

The signal lines 14 and shield lines 12 may comprise any suitable electrically conductive composition(s), such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). The conductive materials of the signal lines 14 and shield lines 12 may be homogenous, or may comprise two or more discrete compositions. The conductive material of the shield lines 12 may be the same as the conductive material of the signal lines 14, or may be different from the conductive material of the signal lines. Further, the lines 12/14 of wiring layer M3 may be the same composition as one or more of the lines 30/32 and 40/42 of wiring layers M1 and M2, or may be different compositions from one or more of the lines 30/32 and 40/42 of wiring layers M1 and M2.

The interconnects 20 (only some of which are labeled) are shown along the shield lines 12, with such interconnects 20 being utilized to vertically connect shield lines 12 of wiring layer M3 with shield lines 42 of wiring layer M2 (shown in FIG. 11). The overlay regions 18a and 18b are diagrammatically indicated in FIGS. 11 and 12, and such correspond to regions where the interconnects 20 vertically connect shield lines 12 of wiring layer M3 with the shield lines 42 of wiring layer M2.

Region A is diagrammatically illustrated relative to the wiring layers M2 and M3 of FIGS. 11 and 12, and such region comprises a redundant (dummy) region (e.g., lane). One of the shield lines 42 of FIG. 11 is identified with a label 42a to distinguish such shield line from the others, and the redundant region of wiring layer M2 includes a widened structure 45 along the shield line 42a. One of the shield lines 12 of FIG. 12 is identified with a label 12a to distinguish such shield line from the others, and the redundant region of wiring layer M3 includes a widened structure 17 along the shield line 12a.

In some embodiments, the wiring layers M2 and M3 of FIGS. 11 and 12 may be referred to as a lower-level wiring layer and an upper-level wiring layer, respectively; and may be considered to comprise the shown first wiring tracks, second wiring tracks, third wiring tracks and fourth wiring tracks (labeled as first, second, third and fourth tracks in FIGS. 11 and 12). The first, second, third and fourth wiring tracks of the upper wiring layer M3 directly overlay the first, second, third and fourth wiring tracks of the lower wiring layer M2, and are within the redundant regions (i.e., redundant lanes).

The first, second, third and fourth wiring tracks extend in a first direction along an x-axis (with the x-axis being shown adjacent the portions of assembly 10c along FIGS. 11 and 12), and extend parallel to one another (or at least substantially parallel to one another, with the term "substantially parallel" meaning parallel to within reasonable tolerances of fabrication and measurement). The first and third wiring tracks sandwich the second wiring track therebetween; and the second and fourth wiring tracks sandwich the third wiring track therebetween.

In some embodiments, the lower-level wiring layer M2 may be considered to comprise a first wiring corresponding to the wiring of shield line 42a. The first wiring may be considered to have a first portion 50 extending along the second wiring track, a second portion 52 extending along the first wiring track, and a third portion 54 extending along the third wiring track. The first portion 50 may be considered to comprise a first side 51 and a second side 53 in opposing relation to the first side. The second portion 52 may be considered to be offset from the first side 51 of the first portion 50 by a first offset region 56, and the third portion 54 may be considered to be offset from the second side 53 by a second offset region 58. In the shown embodiment, the first, second and third portions 50, 52 and 54 extend along the direction of the x-axis. The second portion 52 is offset from the second wiring track by projections 55 and 57 which extend along a y-axis. The third portion 54 is offset from the second wiring track by projections 59 and 61 which extend along the y-axis. The first, second and third portions 50, 52 and 54 may be considered to extend along a first direction (the direction of the x-axis); and the projections 55, 57, 59 and 61 may be considered to extend along a second direction (the direction of the y-axis). In the shown embodiment, the second direction is orthogonal to the first direction. In other embodiments, the first and second directions may intersect one another without being orthogonal to one another.

Figure 14:
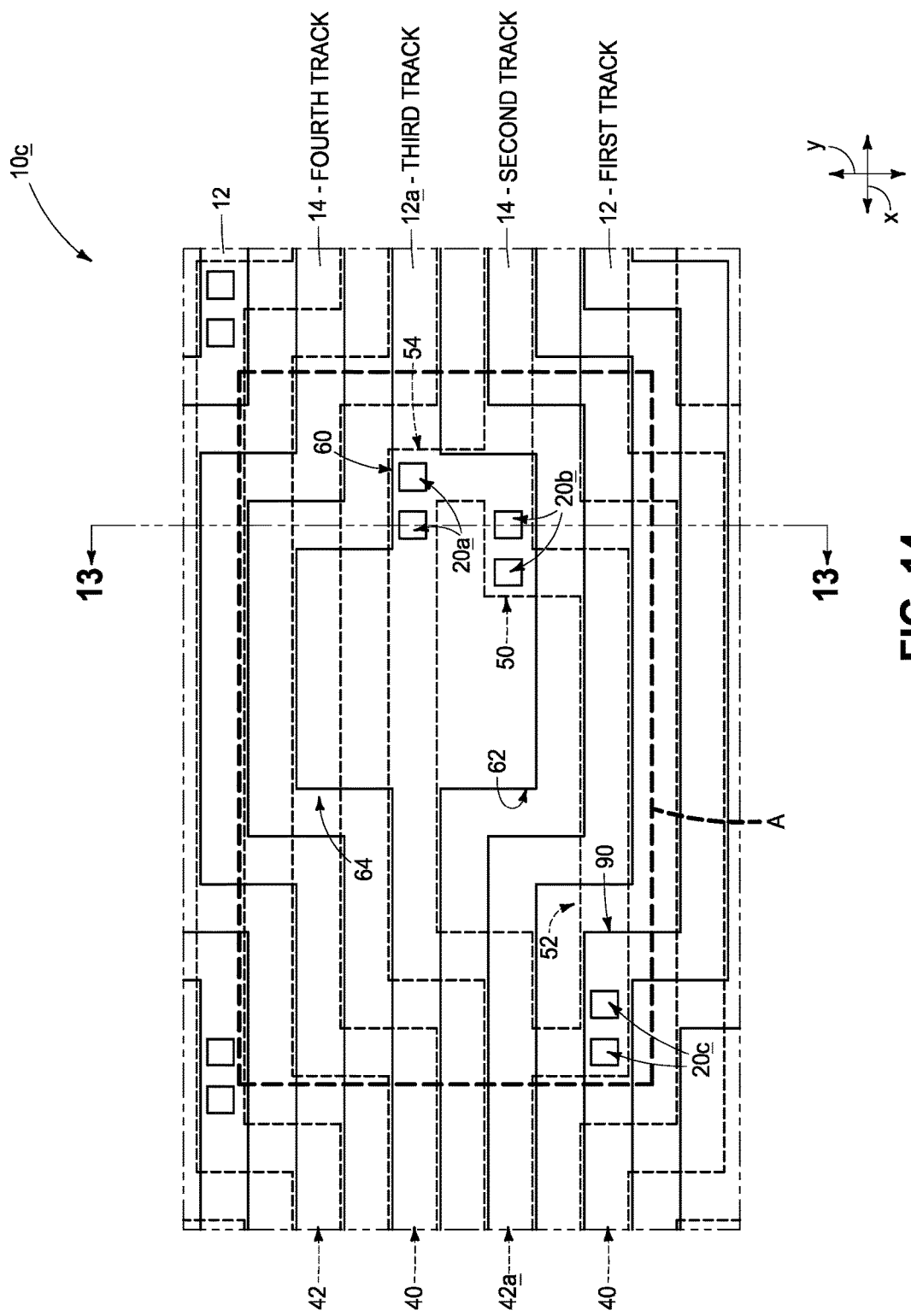
FIG. 14 is a view of an expanded region of FIGS. 11 and 12, and shows the wiring layer of FIG. 12 stacked over that of FIG. 11. The region of FIG. 14 is indicated by a dashed line "FIG. 14" in FIGS. 11 and 12.

The upper-level wiring layer M3 may be considered to comprise a second wiring (i.e., the wiring of shield line 12a). The second wiring 12a is connected to the first wiring 42a through the interconnects 20a and 20b (with interconnects 20a and 20b being identical to the other interconnects 20, but being labeled 20a and 20b so that they may be separately identified from the other interconnects). In some embodiments, the second wiring 12a may be considered to comprise a fourth portion 60 which extends along the third wiring track, and to comprise a fifth portion 62 which extends along the second wiring track. The third portion 54 of the first wiring 42a (FIG. 11) is electrically coupled to the fourth portion 60 of the second wiring 12a (FIG. 12) through the interconnects 20a, and the first portion 50 of the first wiring 42a (FIG. 11) is electrically coupled with the fifth portion 62 of the second wiring 12a (FIG. 12) through the interconnects 20b. FIG. 14 shows an overlay of an expanded region of FIGS. 11 and 12; and shows the overlap of the third portion 54 with the fourth portion 60, and the overlap of the first portion 50 and fifth portion 62.

Figure 13:
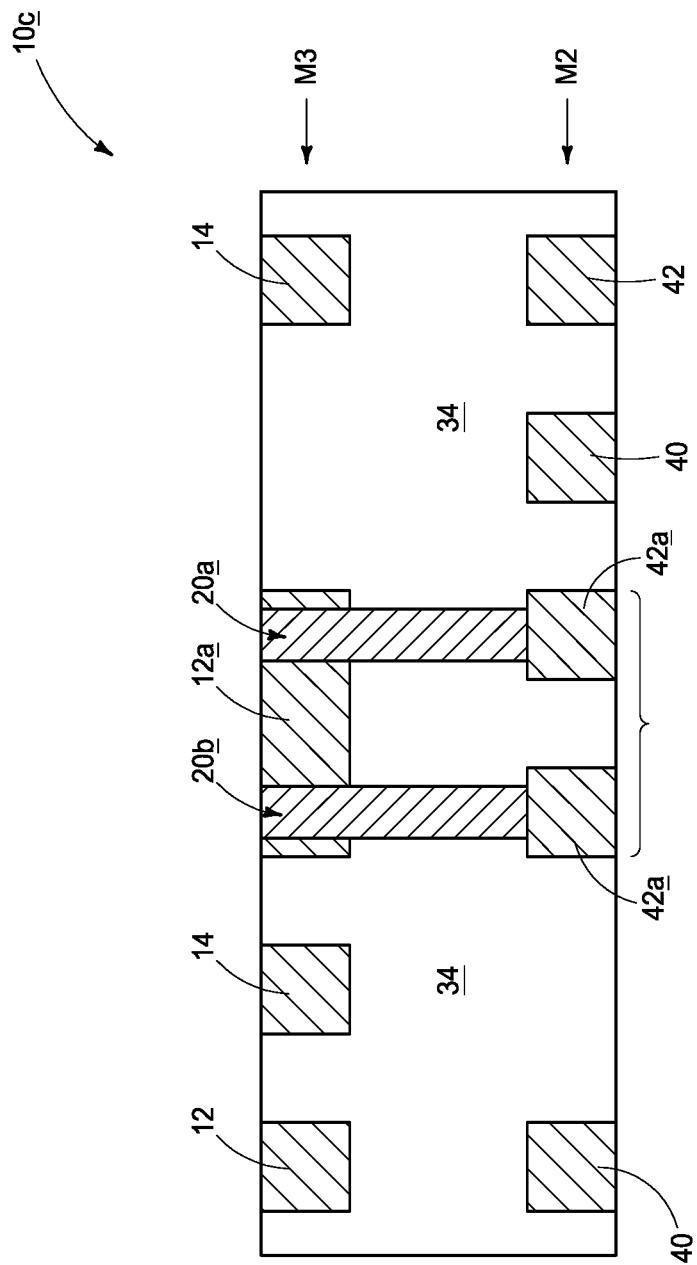
FIG. 13 is a diagrammatic cross-sectional side view along a line 13-13 shown in FIGS. 11 and 12, and through the wiring layers M2 and M3 of FIGS. 11 and 12.

FIG. 13 shows a cross-section along the line 13-13 of FIGS. 11 and 12, and shows the interconnects 20a/20b extending through insulative material 34 to electrically couple shield line 12a of the upper-level wiring layer M3 with the shield line 42a of the lower-level wiring layer M2. Although the illustrated embodiment shows two contact plugs corresponding to interconnects 20a/20b, in other embodiments there may be only a single contact plug, and in yet other embodiments there may be more than two contact plugs.

In some embodiments, the first wiring 42a of lower-level wiring layer M2 may be considered to comprise the first portion 50, second portion 52 and third portion 54 described above; and may be further considered to comprise a fourth portion corresponding to projection 57 (with such fourth portion coupling the first portion 50 with the second portion 52), and a fifth portion corresponding to projection 59 (with such fifth portion coupling the first portion 50 with the third portion 54). In such embodiments, the second wiring 12a of the upper-level wiring layer M3 may be considered to comprise portion 60 as a sixth portion extending along the third wiring track, and portion 62 as a seventh portion extending along the second wiring track. The second wiring 12a also comprises an eighth portion 64 extending along the fourth wiring track, a ninth portion 66 extending along the y-axis and coupling the sixth portion 60 with the seventh portion 62, and a tenth portion 68 extending along the y-axis and coupling the sixth portion 60 with the eighth portion 64. The contact plugs 20a of FIGS. 11 and 12 may be considered to penetrate an insulative layer corresponding to insulative material 34, and couple the third portion 54 of the first wiring 42a with the sixth portion 60 of the second wiring 12a; and similarly the contact plugs 20b may be considered to penetrate the insulative layer corresponding to insulative material 34 and couple the first portion 50 of the first wiring 42a with the seventh portion 62 of the second wiring 12a.

In some embodiments, the lower-level wiring layer M2 may be considered to further comprise a third wiring 40a (i.e., one of the signal lines) which is electrically disconnected from the first wiring 42a; and which has an eleventh portion 70 along the third wiring track, a twelfth portion 72 along the fourth wiring track, and a thirteenth portion 71 which extends along the y-axis and couples the eleventh portion 70 with the twelfth portion 72.

In some embodiments, the upper-level wiring layer M3 may be considered to further comprise a fourth wiring 14a (i.e., one of the signal lines) which is electrically disconnected from the first wiring 12a, and which has a fourteenth portion 80 along the second wiring track, a fifteenth portion 82 along the first wiring track, and a sixteenth portion 83 which extends along the y-axis and couples the fourteenth portion 80 with the fifteenth portion 82.

In some embodiments, the shield line 12a of the upper-level wiring layer M3 may be referred to as a first shield line, and another shield line 12b may be referred to as a second shield line. The second shield line 12b has a portion 90 extending along the first wiring track and vertically overlapping the second portion 52 of the shield line 42a of the lower-level wiring layer M2. The portion 90 of shield line 12b is coupled with the portion 52 of shield line 42a through interconnects labeled as 20c (shown in FIGS. 11 and 12, and also shown in FIG. 14).

In some embodiments, the first, second and third portions 50, 52 and 54 of the shield line 42a within wiring layer M2, together with the projections 55, 57, 59 and 61 of the shield line 42a, may be considered to comprise the widened structure 45 along the shield line 42a (shown in FIG. 11). FIGS. 15A-C illustrate some example embodiments of such widened structure 45. FIG. 15A shows the widened structure 45 of FIG. 11. Such has the projection 59 (which may be referred to as a fourth portion of shield line 42a in some embodiments) extending in a same direction as the projection 55 (which may be referred to as a fifth portion in some embodiments), but entirely out of alignment (i.e., displaced along the x-axis) relative to the projection 55. Such also has the projection 61 extending in a same direction as the projection 57, but entirely out of alignment (i.e. offset) relative to the projection 57. In contrast, FIG. 15B shows a widened structure 45a having a configuration in which a region of projection 55 is aligned with a region of projection 59, and a region of projection 57 is aligned with a region of projection 61.

The embodiments of FIGS. 15A and 15B retain insulative regions 102 between the second and third portions 52 and 54 of the shield line 42a. In some embodiments, each insulative region 102 may be considered to comprise a first void region 104 corresponding to a first offset region 101 between the first portion 50 of shield line 42a and the second portion 52 of the shield line 42a, and to comprise a second void region 106 corresponding to a second offset region 103 between the first portion 50 and the third portion 54. The regions 104 and 106 are referred to as "void" regions to indicate that the regions do not comprise conductive material. It is to be understood that such regions may or may not be empty; and, for example, in some embodiments the void regions 104 and 106 may comprise insulative material, such as, for example, one or both of silicon dioxide and silicon nitride.

The insulative region 102 within the widened structures (45/45a) is optional, and may be replaced with conductive material. For instance, FIG. 15C shows a widened structure 45b having a configuration in which conductive material of shield line 42a fills the first and second offset regions 101 and 103 (i.e., a configuration in which the first and second offset regions 101 and 103 are entirely comprised by conductive material).

In some embodiments, the sixth, seventh, eighth, ninth and tenth portions 60, 62, 64, 66 and 68 of the shield line 12a within wiring layer M3 may be considered to comprise the widened structure 17 of FIG. 12. The ninth and tenth portions 66 and 68 include respective parts that are aligned along the y-axis, and include parts that are not aligned along the y-axis. In some embodiments, an entirety of the ninth portion 66 may be aligned with an entirety of the tenth portion 68 along the y-axis; and in some embodiments, an entirety of the ninth portion 66 may be out of alignment with an entirety of the tenth portion 68 along the y-axis (i.e., may be displaced along the x-axis relative to the tenth portion).

In the shown embodiment of FIG. 12, conductive material of shield line 12a extends entirely across the widened structure 17. In other embodiments, an insulative region analogous to the region 102 of FIGS. 15A and 15B may be provided within the widened structure 17.

Figure 16:
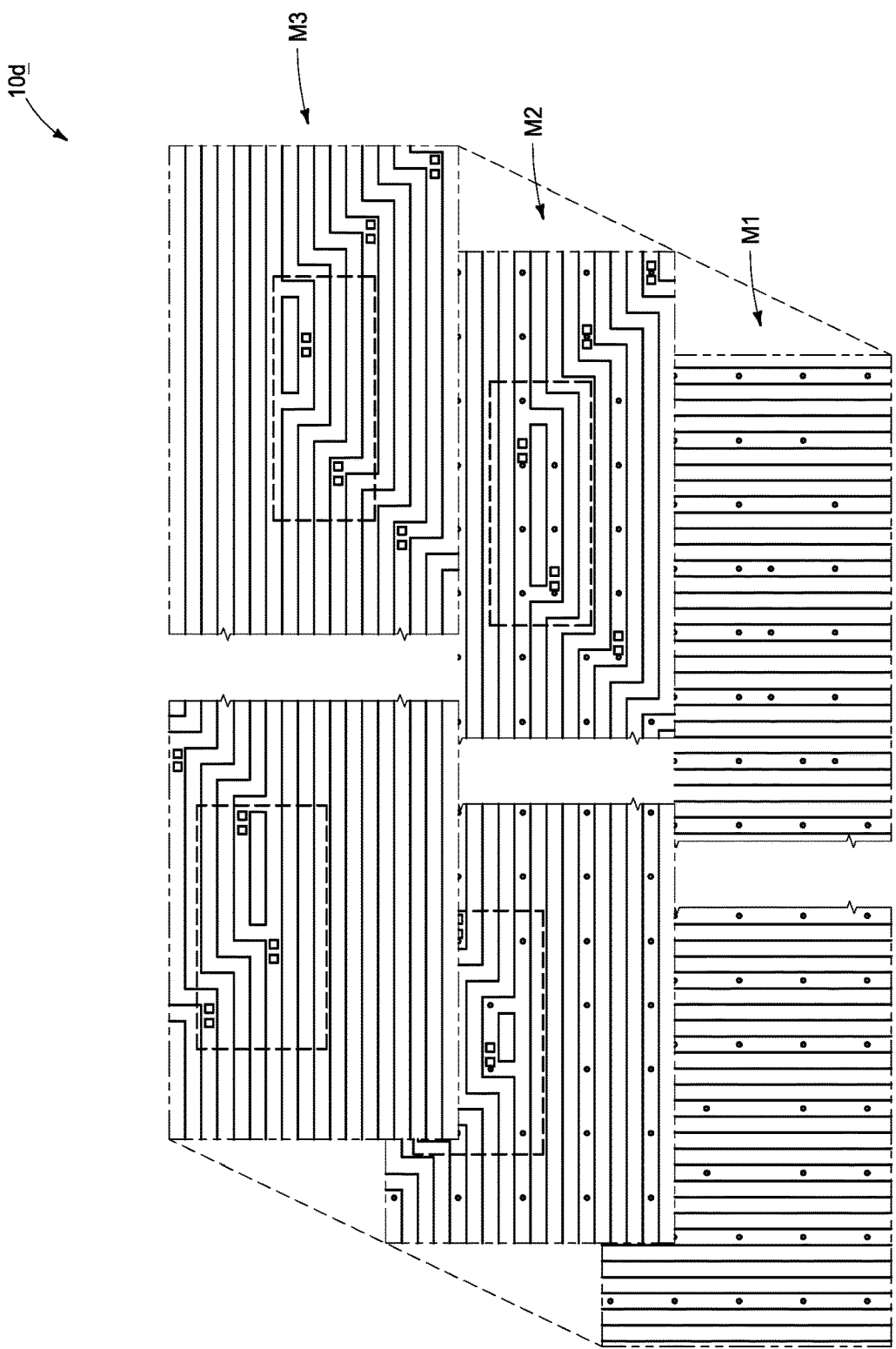
FIG. 16 is an exploded view of an assembly of example wiring layers that may be utilized in one of the circuit arrangements of FIG. 8. Three layers are stacked in the view of FIG. 16.
Figure 17:
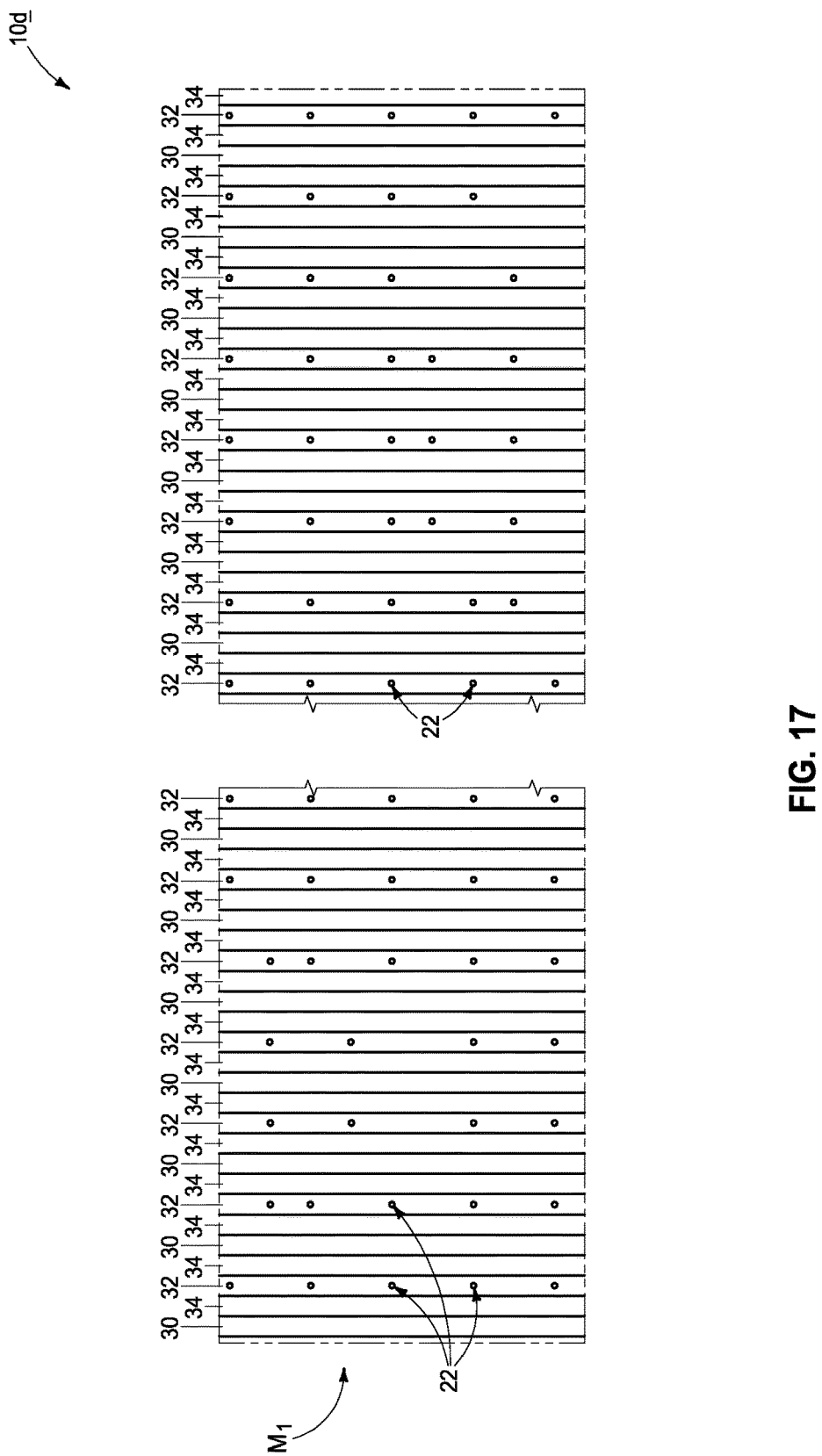
FIGS. 17-19 are diagrammatic top views of the individual layers of FIG. 16.
Figure 18:
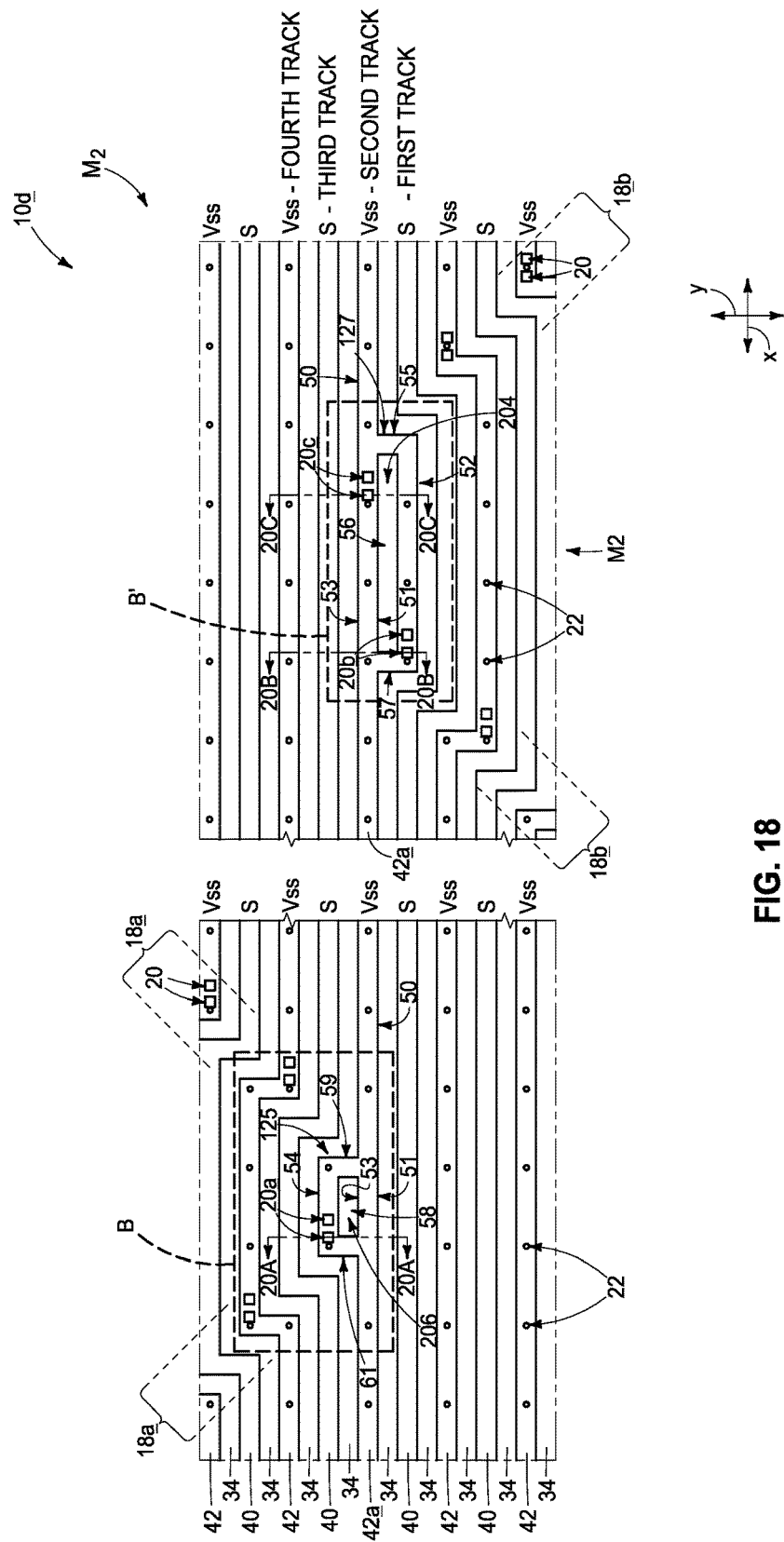
Figure 19:
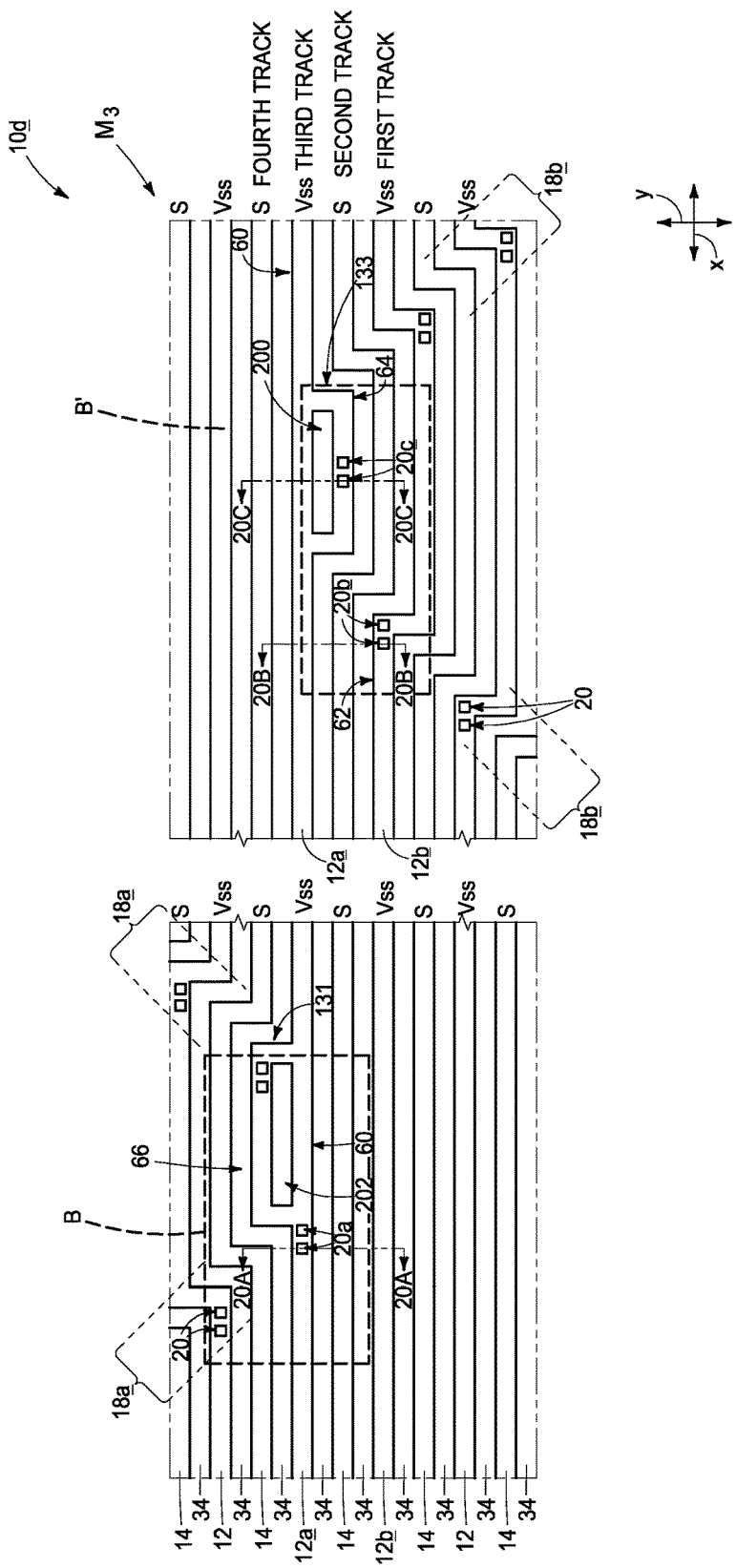

FIGS. 16-19 illustrate assembly 10d (previously described in FIG. 8), and show the wiring layers M1, M2 and M3. FIG. 16 is an exploded view showing the wiring layers stacked one atop another; while FIGS. 17-19 show each of the individual wiring layers M1, M2 and M3 in isolation.

Referring to FIG. 17, the wiring layer M1 includes signal lines 30 alternating with shield lines 32. The signal lines and shield lines are spaced from one another by insulative material 34. The shield lines 32 are shown coupled with a fixed voltage identified as Vss, but may be coupled with any suitable voltage.

The interconnects 22 (only some of which are labeled) are shown along the shield lines 32, with such interconnects 22 being utilized to vertically connect shield lines 32 of wiring layer M1 with shield lines 42 of wiring layer M2 (shown in FIG. 18).

Referring to FIG. 18, the wiring layer M2 includes signal lines 40 alternating with shield lines 42. The signal lines and shield lines are spaced from one another by the insulative material 34. The shield lines 42 are shown coupled with a fixed voltage identified as Vss, but may be coupled with any suitable voltage.

The interconnects 22 (only some of which are labeled) are shown along the shield lines 42, with such interconnects 22 being utilized to vertically connect shield lines 42 of wiring layer M2 with shield lines 32 of wiring layer M1 (shown in FIG. 17). The interconnects 20 (only some of which are labeled) are also shown along the shield lines 42, with such interconnects 20 being utilized to vertically connect shield lines 42 of wiring layer M2 with shield lines 12 of wiring layer M3 (shown in FIG. 19). The interconnects 20 are shown in paired arrangements (i.e., two interconnects 20 are in each location where shield lines 42 of wiring layer M2 are to connect with shield lines 12 of wiring layer M3). In other embodiments, only a single interconnect 20 may be in at least some of such locations; and in some embodiments, more than two interconnects 20 may be in at least some of such locations.

Referring to FIG. 19, the wiring layer M3 includes signal lines 14 alternating with shield lines 12. The signal lines and shield lines are spaced from one another by the insulative material 34. The shield lines 12 are shown coupled with a fixed voltage identified as Vss, but may be coupled with any suitable voltage.

The interconnects 20 (only some of which are labeled) are also shown along the shield lines 12, with such interconnects 20 being utilized to vertically connect shield lines 12 of wiring layer M3 with shield lines 42 of wiring layer M2 (shown in FIG. 18). The overlay regions 18a and 18b are diagrammatically indicated in FIGS. 18 and 19, and such correspond to regions where the interconnects 20 vertically connect shield lines 12 of wiring layer M3 with the shield lines 42 of wiring layer M2.

Regions B and B' are diagrammatically illustrated relative to the wiring layers M2 and M3 of FIGS. 18 and 19, and such regions comprise redundant (dummy) regions (e.g., lanes). Specifically, one of the shield lines 42 of FIG. 11 is identified with a label 42a to distinguish such shield line from the others. The redundant region of wiring layer M2 includes a widened structure 125 along the shield line 42a in region B, and includes a widened structure 127 along the shield line 42a in region B'. One of the shield lines 12 of FIG. 12 is identified with a label 12a to distinguish such shield line from the others, and the redundant region of wiring layer M3 includes widened structures 131 and 133 along the shield line 12a in regions B and B', respectively.

In some embodiments, the wiring layers M2 and M3 of FIGS. 18 and 19 may be referred to as a lower-level wiring layer and an upper-level wiring layer, respectively; and may be considered to comprise the shown first wiring tracks, second wiring tracks, third wiring tracks and fourth wiring tracks (labeled as first, second, third and fourth tracks in FIGS. 18 and 19). The first, second, third and fourth wiring tracks of the upper wiring layer M3 directly overlay the first, second, third and fourth wiring tracks of the lower wiring layer M2.

The first, second, third and fourth wiring tracks extend in a first direction along an x-axis, and extend parallel to one another (or at least substantially parallel to one another). The first and third wiring tracks sandwich the second wiring track therebetween; and the second and fourth wiring tracks sandwich the third wiring track therebetween.

In some embodiments, the lower-level wiring layer M2 may be considered to comprise first wiring corresponding to the wiring of shield line 42a. The first wiring may be considered to have portions 50, 52 and 54 analogous to those described above relative to the embodiment of FIGS. 9-12. Specifically, the first wiring 42a has the first portion 50 extending along the second wiring track (and extending across both of regions B and B'), the second portion 52 extending along the first wiring track (and within the region B'), and the third portion 54 extending along the third wiring track (and within the region B). The first portion 50 may be considered to comprise the first side 51 and the second side 53 in opposing relation to the first side. The second portion 52 may be considered to be offset from the first side 51 of the first portion 50 by the first offset region 56, and the third portion 54 may be considered to be offset from the second side 53 by the second offset region 58. In the shown embodiment, the first, second and third portions 50, 52 and 54 extend along the direction of the x-axis. The second portion 52 is offset from the second wiring track by the projections 55 and 57 which extend along a y-axis. The third portion 54 is offset from the second wiring track by the projections 59 and 61 which extend along the y-axis.

The upper-level wiring layer M3 may be considered to comprise second wiring corresponding to the wiring of shield line 12a. The second wiring 12a is connected to the first wiring 42a, and may be considered to have a fourth portion 60 analogous to that described above relative to the embodiment of FIGS. 9-12. The fourth portion 60 extends along the third wiring track, and is electrically coupled to the third portion 54 of the first wiring 42a (FIG. 18) through the interconnects 20a.

Figure 20A:
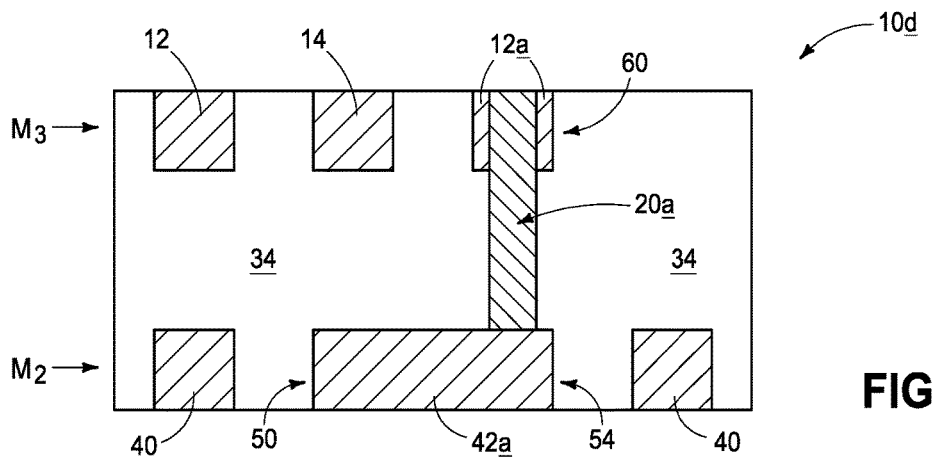
FIGS. 20A-C are diagrammatic cross-sectional side views along lines 20A-20A, 20B-20B and 20C-20C of FIGS. 18 and 19, and are through the wiring layers M2 and M3 of FIGS. 18 and 19.

FIG. 20A shows a cross-section along the line 20A-20A of FIGS. 18 and 19, and shows an interconnect 20a extending through insulative material 34 to electrically couple shield line 12a of the upper-level wiring layer M3 with the shield line 42a of the lower-level wiring layer M2.

Figure 20B:
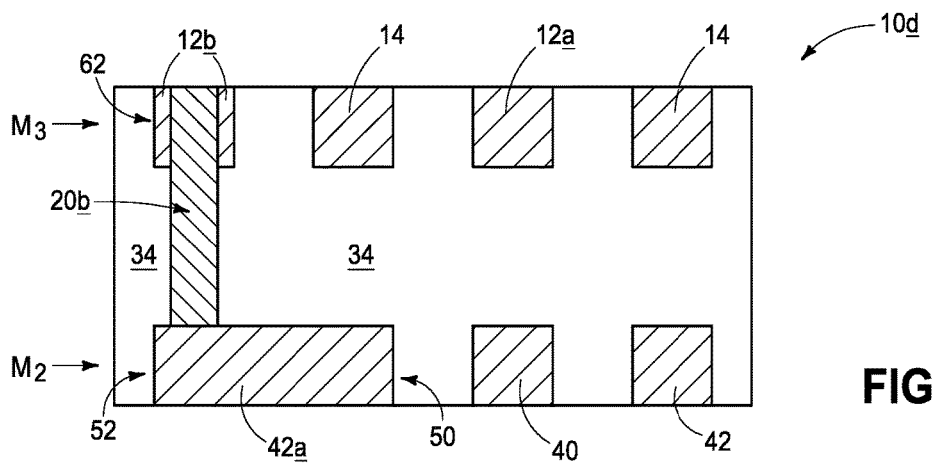

The upper-level wiring layer M3 (FIG. 19) comprises a third wiring 12b having a fifth portion 62 analogous to the portion 62 of the embodiment of FIGS. 9-12. The fifth portion 62 of third wiring 12b extends along the first wiring track, and is electrically coupled with the second portion 52 of the lower-level wiring layer M2 (FIG. 18) through the interconnects 20b. A cross-section along the line 20B-20B is shown in FIG. 20B, and such shows the coupling of the fifth portion 62 and the second portion 52 through an interconnect 20b.

Figure 20C:
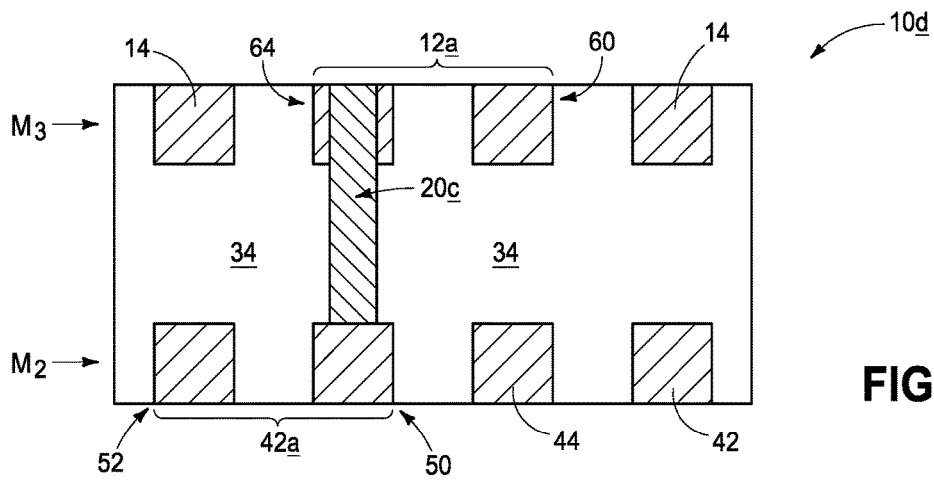

In some embodiments, the first wiring 42a of lower-level wiring layer M2 may be considered to comprise the first portion 50, second portion 52 and third portion 54. The upper-level wiring layer M3 may be considered to comprise the wiring 12b as the second wiring, and to comprise the wiring 12a as the third wiring. The second wiring 12b comprises a fourth portion 62 along the first wiring track, and the third wiring 12a comprises a fifth portion 60 extending along the third wiring track. At least one contact plug 20b penetrates insulative layer of material 34 to couple the second portion 52 of the first wiring 42a with the fourth portion 62 of the second wiring 12b; and at least one contact plug 20a penetrates insulative layer of material 34 to couple the third portion 54 of the first wiring 42a with the fifth portion 60 of the third wiring 12a. In the shown embodiment, the third wiring 12a has a sixth portion 64 which extends along the second wiring track, and which is electrically coupled with the first portion 50 of the lower-level wiring 42a (FIG. 18) through the interconnects 20c. A cross-section along the line 20C-20C is shown in FIG. 20C, and such shows the coupling of the sixth portion 64 and the first portion 50 through an interconnect 20c.

Figure 21:
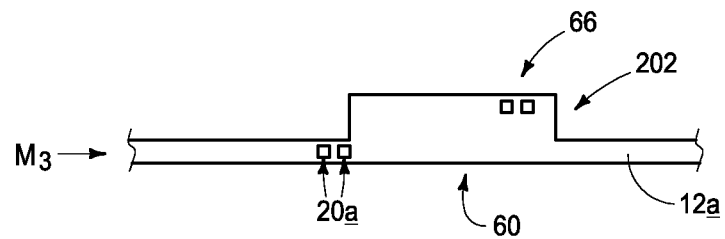
FIGS. 21 and 22 are expanded diagrammatic top views of regions of the wiring layer M3 of FIG. 19 showing example alternative configurations.
Figure 22:
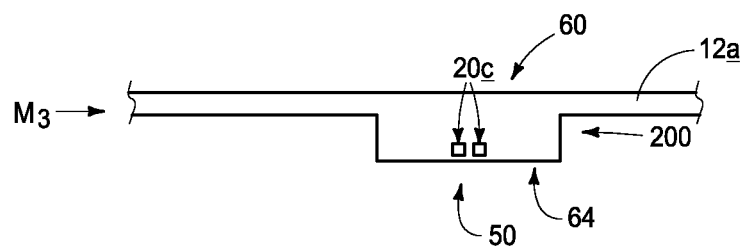

In some embodiments, the third wiring 12a of the upper-level wiring layer M3 may be considered to further comprise a seventh portion 66 extending along the fourth wiring track. The fifth and sixth portions (60 and 64) are offset from one another by a first offset region 200, and the fifth and seventh portions (60 and 64) are offset from one another by a second offset region 202. The first and second offset regions 200 and 202 may comprise void regions, as shown in FIG. 19. Alternatively, the first and second offset regions 200 and 202 may be filled with conductive material of shield line 12a (i.e., may entirely comprise such conductive material), as shown in FIGS. 21 and 22.

In some embodiments, the first wiring 42a of the lower-level wiring layer M2 may be considered to further comprise a ninth portion (corresponding to projection 55 or 57) extending along the y-axis to couple the first and second portions 50 and 52 to one another, and tenth portion (corresponding to projection 59 or 61) extending along the along the y-axis to couple the first and third portions 50 and 54 to one another.

Figure 23:
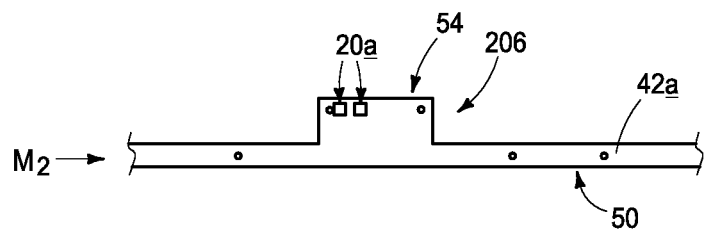
FIGS. 23 and 24 are expanded diagrammatic top views of regions of the wiring layer M2 of FIG. 18 showing example alternative configurations.
Figure 24:
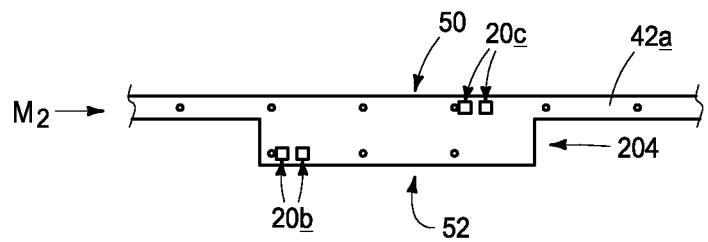

In some embodiments, the first and second portions (50 and 52) of first wiring 42a may be considered to be offset from one another by a third offset region 204, and the first and third portions (50 and 44) of first wiring 42a may be considered to be offset from one another by a fourth offset region 206. The third and fourth offset regions 204 and 206 may comprise void regions, as shown in FIG. 18. Alternatively, the third and fourth offset regions 204 and 206 may be filled with conductive material of shield line 42a (i.e., may entirely comprise such conductive material), as shown in FIGS. 23 and 24.

The structures discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

Structures (e.g., conductive plugs) may be referred to as "extending vertically" to indicate that the structures generally extend upwardly from an underlying base. The vertically-extending structures may extend substantially orthogonally relative to an upper surface of the base, or not.

Some embodiments include an apparatus having first, second, third and fourth wiring tracks over a substrate. The first, second, third and fourth wiring tracks extend in a first direction. The first and third wiring tracks sandwich the second wiring track therebetween, and the second and fourth wiring tracks sandwich the third wiring track therebetween. A lower-level wiring layer includes a first wiring which has a first portion extending along the second wiring track, a second portion extending along the first wiring track, and a third portion extending along the third wiring track. The second portion is offset along a first side of the first portion by a first offset region, and the third portion is offset along a second side of the first portion by a second offset region. The first side is in opposing relation to the second side. An upper-level wiring layer includes a second wiring electrically connected to the first wiring and having a fourth portion extending along the third wiring track. The third portion of the first wiring is electrically coupled with the fourth portion of the second wiring.

Some embodiments include an apparatus having first, second, third and fourth wiring tracks over a substrate. The first, second, third and fourth wiring tracks extend in a first direction and are substantially parallel to one another. The first and third wiring tracks sandwich the second wiring track therebetween, and the second and fourth wiring tracks sandwich the third wiring track therebetween. A lower-level wiring layer comprises a first wiring. The first wiring comprises a first portion extending along the second wiring track, a second portion extending along the first wiring track, a third portion extending along the third wiring track, a fourth portion extending in a second direction crossing the first direction to couple the first portion and the second portion, and a fifth portion extending in the second direction to couple the first portion and the third portion. An upper-level wiring layer comprises a second wiring electrically connected to the first wiring. The second wiring comprises a sixth portion extending along the third wiring track, a seventh portion extending along the second wiring track, an eighth portion extending along the fourth wiring track, a ninth portion extending in the second direction to couple the sixth portion and the seventh portion, and a tenth portion extending in the second direction to couple the sixth portion and the eighth portion.

Some embodiments include an apparatus having first, second, third and fourth wiring tracks over a substrate. The first, second, third and fourth wiring tracks extend in a first direction and are substantially parallel to one another. The first and third wiring tracks sandwich the second wiring track therebetween, and the second and fourth wiring tracks sandwich the third wiring track therebetween. A lower-level wiring layer comprises a first wiring. The first wiring comprises a first portion extending along the second wiring track, a second portion extending along the first wiring track, and a third portion extending along the third wiring track. An upper-level wiring layer comprises second and third wirings electrically connected to the first wiring. The second wiring comprises a fourth portion extending along the first wiring track, and the third wiring comprises a fifth portion extending along the third wiring track. An insulating layer is between the lower-level wiring layer and the upper-level wiring layer. At least one contact plug penetrates the insulating layer to couple the second portion of the first wiring and the fourth portion of the second wiring. At least one contact plug penetrates the insulating layer to couple the third portion of the first wiring and the fifth portion of the third wiring.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An apparatus comprising:
   first, second, third and fourth wiring tracks over a substrate, wherein the first, second, third and fourth wiring tracks extend in a first direction and are substantially parallel to one another, wherein the first and third wiring tracks sandwich the second wiring track therebetween, and wherein the second and fourth wiring tracks sandwich the third wiring track therebetween;
   a lower-level wiring layer comprising a first wiring, wherein the first wiring comprises a first wiring line having a first line portion extending along the second wiring track, a second line portion extending along the first wiring track, and a third line portion extending along the third wiring track; the second line portion being on a first side of the first line portion and being offset from the first line portion by a first offset region, and the third line portion being on a second side of the first line portion and being offset from the first line portion by a second offset region; wherein the first side is in opposing relation to the second side;
   an upper-level wiring layer disposed over the lower-level wiring layer and comprising second wiring electrically connected to the first wiring, wherein the second wiring comprises a second wiring line having a fourth line portion extending along the third wiring track; and
   the third line portion of the first wiring being electrically coupled with the fourth line portion of the second wiring.

2. The apparatus of claim 1, wherein:
   the first offset region includes a first void region; and
   the second offset region includes a second void region.

3. The apparatus of claim 1, wherein:
   the first offset region is entirely comprised by conductive material; and
   the second offset region is entirely comprised by conductive material.

4. The apparatus of claim 1, wherein:
   the second wiring line has a fifth line portion extending along the second wiring track; and
   the fifth line portion of the second wiring line is electrically coupled with the first line portion of the first wiring line.

5. The apparatus of claim 1, wherein:
   the upper-level wiring layer comprises a third wiring line having a fifth line portion extending along the first wiring track; and
   the fifth line portion of the third wiring line is electrically coupled with the second line portion of the first wiring line.

6. An apparatus comprising:
   first, second, third and fourth wiring tracks over a substrate, wherein the first, second, third and fourth wiring tracks extend in a first direction and are substantially parallel to one another, wherein the first and third wiring tracks sandwich the second wiring track therebetween, and wherein the second and fourth wiring tracks sandwich the third wiring track therebetween;
   a lower-level wiring layer comprising a first wiring including a first wiring line, wherein the first wiring line comprises a first line portion extending along the second wiring track, a second line portion extending along the first wiring track, a third line portion extending along the third wiring track, a first connecting region extending in a second direction crossing the first direction to couple the first line portion and the second line portion, and a second connecting region extending in the second direction to couple the first line portion and the third line portion; and
   an upper-level wiring layer comprising a second wiring electrically connected to the first wiring, wherein the second wiring includes a second wiring line that comprises a fourth-line portion extending along the third wiring track, a fifth line portion extending along the second wiring track, a sixth line portion extending along the fourth wiring track, a third connecting region extending in the second direction to couple the fourth line portion and the fifth line portion, and a fourth connecting region extending in the second direction to couple the fourth line portion and the sixth line portion.

7. The apparatus of claim 6, further comprising an insulating layer between the lower-level wiring layer and the upper-level wiring layer, and at least one contact plug penetrating the insulating layer to couple the first line portion of the first wiring line and the fifth line portion of the second wiring line.

8. The apparatus of claim 6, further comprising an insulating layer between the lower-level wiring layer and the upper-level wiring layer, and at least one contact plug penetrating the insulating layer to couple the third line portion of the first wiring line and the fourth line portion of the second wiring line.

9. The apparatus of claim 6, wherein the first connecting region and the second connecting region include respective parts that are aligned in line with one another in the second direction and the third connecting region and the fourth connecting region include respective parts that are aligned in line with one another in the second direction.

10. The apparatus of claim 6, wherein the first connecting region is out of alignment with the second connecting region in the second direction and the third connecting region is out of alignment with the fourth connecting region in the second direction.

11. The apparatus of claim 6, wherein each of the first wiring line and the second wiring line is supplied with a fixed voltage.

12. The apparatus of claim 6, wherein the lower-level wiring layer further comprises a third wiring line electrically disconnected from the first wiring line, wherein the third wiring comprises an seventh line portion extending along the third wiring track, an eighth line portion extending along the fourth wiring track, and a fifth connecting region extending in the second direction to couple the seventh line portion and the eighth line portion.

13. The apparatus of claim 6, wherein the upper-level wiring layer further comprises a fourth wiring line electrically disconnected from the second wiring line, wherein the fourth wiring line comprises a ninth line portion extending along the second wiring track, a tenth line portion extending along the first wiring track, and a sixth connecting region extending in the second direction to couple the ninth line portion and the tenth line portion.

14. An apparatus comprising:
first, second, third and fourth wiring tracks over a substrate, wherein the first, second, third and fourth wiring tracks extend in a first direction and are substantially parallel to one another, wherein the first and third wiring tracks sandwich the second wiring track therebetween, and wherein the second and fourth wiring tracks sandwich the third wiring track therebetween;
a lower-level wiring layer comprising a first wiring line, wherein the first wiring line comprises a first portion extending along the second wiring track, a second portion extending along the first wiring track, and a third portion extending along the third wiring track;
an upper-level wiring layer comprising a second wiring line electrically connected to the first wiring line and a third wiring line electrically connected to the first wiring line, wherein the second wiring line comprises a fourth line portion extending along the first wiring track, and wherein the third wiring line comprises a fifth portion extending along the third wiring track;
an insulating layer between the lower-level wiring layer and the upper-level wiring layer;
at least one contact plug penetrating the insulating layer to couple the second portion of the first wiring line and the fourth portion of the second wiring line; and
at least one contact plug penetrating the insulating layer to couple the third portion of the first wiring line and the fifth portion of the third wiring line.

15. The apparatus of claim 14, wherein:
the third wiring line has a sixth portion along the second wiring track and a seventh portion along the fourth wiring track;
the fifth and sixth portions are offset from one another by a first void region; and
the fifth and seventh portions are offset from one another by a second void region.

16. The apparatus of claim 14, wherein:
the third wiring line has a sixth portion along the second wiring track and a seventh portion along the fourth wiring track;
the fifth and sixth portions are offset from one another, with said offset between the fifth and sixth portions being entirely comprised by conductive material; and
the fifth and seventh portions are offset from one another, with said offset between the fifth and seventh portions being entirely comprised by conductive material.

17. The apparatus of claim 14, wherein the first wiring line includes an eighth portion extending in a second direction crossing the first direction to couple the first portion and the second portion, and a ninth portion extending in the second direction to couple the first portion and the third portion.

18. The apparatus of claim 14, wherein:
the first portion is offset from the second portion by a third void region; and
the third portion is offset from the second portion by a fourth void region.

19. The apparatus of claim 14, wherein:
the first portion and second portions are offset from one another, with said offset between the first and second portions being entirely comprised by conductive material; and
the second and third portions are offset from one another, with said offset between the second and third portions being entirely comprised by conductive material.

* * * * *